United States Patent [19]
Ito et al.

[11] Patent Number: 5,517,028
[45] Date of Patent: May 14, 1996

[54] ELECTRON BEAM APPARATUS FOR MEASURING A VOLTAGE OF A SAMPLE

[75] Inventors: Akio Ito, Kawasaki; Kazuhiro Nakazawa, Sagamihara; Takayuki Anbe, Kawasaki, all of Japan

[73] Assignee: Fujitsu Limited, Kawasaki, Japan

[21] Appl. No.: 341,103

[22] Filed: Nov. 18, 1994

[30] Foreign Application Priority Data

Dec. 7, 1993 [JP] Japan .................................. 5-306785

[51] Int. Cl.⁶ .................................................. H01J 37/10
[52] U.S. Cl. ........................................... 250/310; 250/305
[58] Field of Search ................................. 250/310, 305, 250/306, 309

[56] References Cited

U.S. PATENT DOCUMENTS

| | | | |
|---|---|---|---|
| 4,766,372 | 8/1988 | Rao | 250/310 |
| 4,812,651 | 3/1989 | Feuerbaum et al. | 250/310 |
| 4,982,091 | 1/1991 | Garth et al. | 250/310 |
| 4,983,830 | 1/1991 | Iwasaki | 250/310 |

FOREIGN PATENT DOCUMENTS 63-78444   4/1988   Japan.
1-200546   8/1989   Japan.

*Primary Examiner*—Bruce C. Anderson
*Attorney, Agent, or Firm*—Nikaido, Marmelstein, Murray & Oram

[57] ABSTRACT

An electron beam apparatus comprises, inside of an objective lens for focussing a primary electron beam e1 and irradiating it on a sample surface, a secondary electron energy analyzer having a retarding mesh electrode for analyzing the energy of a secondary electron e2 emitted from a point on the sample surface at which the primary electron beam e1 is irradiated. The secondary electron energy analyzer comprises a collimation unit for forming one or more electrostatic lenses by a nonuniform electrical field distribution and for having an electrostatic lens collimate the trajectory of a secondary electron e2 for its injection into a retarding grids (mesh electrode). The collimation unit comprises at least three cylindrical electrodes positioned between the sample surface and the retarding grid (mesh electrode) and numbered first, second and third from the one closest to the sample surface. An external power supply module applies an appropriate voltage to each of these cylindrical electrodes for having each duo of neighboring cylindrical electrodes form an electrostatic lens.

26 Claims, 17 Drawing Sheets $V_{SP}=20v$

MAGNETIC
FLUX
DENSITY

ELECTRIC
POTENTIAL

FIG. 10A
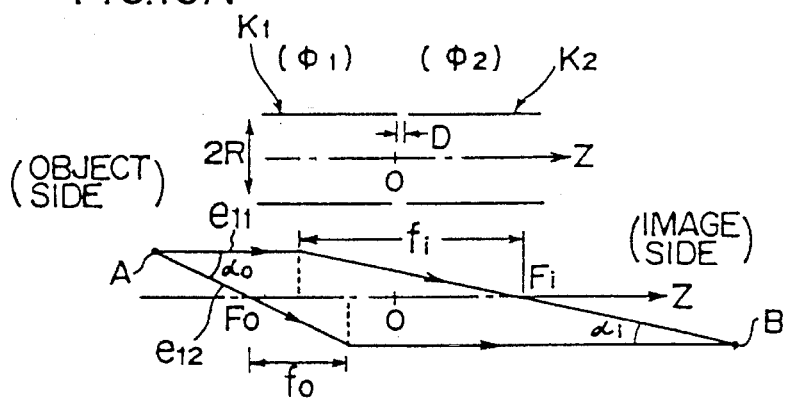
FIG. 10B
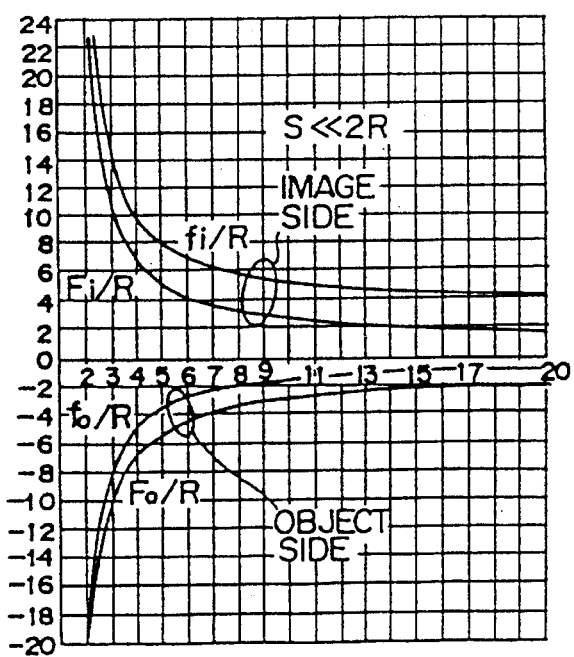
FIG. 10C

SAMPLE VOLTAGE $V_{SP} = -20$ v $V_{SP} = 0$ v

EFFECT OF LENS $L_{23}$
EFFECT OF LENS $L_{23}$ $V_{SP} = 20$ v

ELECTRON BEAM APPARATUS FOR MEASURING A VOLTAGE OF A SAMPLE

BACKGROUND OF THE INVENTION

1. Field of the Invention

This invention pertains to an electron beam apparatus for measuring a voltage at an irradiation point by irradiating a primary electron beam through an objective lens on a sample, such as an internal wire of a semiconductor device like an LSI, and by analyzing a secondary electron e2 emitted from the irradiation point. More specifically, it pertains to an improvement in an in-lens type secondary electron energy analyzer provided inside of an objective lens by reducing the aberration of an objective lens with an aim of narrowing its objective lens magnetic field distribution.

2. Description of the Related Arts

For analyzing an internal operation, for example, of an LSI, an electron beam is used for measuring the voltage waveform of an internal wire. For measuring a voltage waveform, a secondary electron energy analyzer measures the energy of a secondary electron e2 emitted from the internal wire on which a primary electron beam is irradiated. As an LSI is ever more densely integrated, an electron beam used for this purpose needs to be reduced in size. Generally, the shorter a focal length is, the smaller a lens aberration is, which enables a smaller beam size to be formed. Hence, being developed is a new in-lens type secondary electron energy analyzer capable of reducing an aberration by shortening the focal length of an objective lens.

A number of variations in in-lens type secondary electron energy analyzers have been publicly known, which can be broadly classified into two types.

A conventional in-lens type secondary electron energy analyzer of a first kind is a system of having a plurality of planar grids (mesh electrodes) analyze the energy of a secondary electron e2, as disclosed e.g. in Japanese patent publications Tokukaisho 58-192255, 58-197644, 63-78444, 64-10562 and Tokukaihei 01-200546.

A conventional in-lens type secondary electron energy analyzer of a second kind is a system of having a spherical grid (mesh electrode) analyze the energy of a secondary electron e2 having been accelerated by a planar grid (mesh electrode) or a pinhole grid (aperture electrode), as disclosed, for example, in Japanese patent publications Tokukaisho 59-90349, 60-146439, 61-288357.

FIG. 1 shows, as an example of the first kind, an apparatus disclosed in Japanese patent publications Tokukaihei 01-200546.

FIG. 3 shows, as an example of the second kind, an apparatus disclosed in Japanese patent publications Tokukaisho 61-288357.

In either system, an improvement in the accuracy in analyzing the total energy of a secondary electron e2 emitted radially from an electron beam irradiation point is required.

Accordingly, a conventional in-lens type secondary electron energy analyzer of the first kind has its objective lens 1 collimate (make parallel) a secondary electron e2, thereby injecting it into the planar surface of a retarding grid (mesh electrode) 4 as perpendicularly as possible. Likewise, a conventional in-lens type secondary electron energy analyzer of the second kind has its objective lens 11 focus a secondary electron e2, thereby injecting it into the spherical surface of a retarding grid (mesh electrode) 14 as perpendicularly as possible.

FIG. 1 is a squint view illustrating a cutaway of a conventional in-lens type secondary electron energy analyzer, having a plurality of planar mesh electrodes for a magnetic field collimation of a secondary electron e2.

A conventional in-lens type secondary electron energy analyzer of the first kind comprises three planar mesh electrodes, i.e. an extraction grid 2, a collimation grid 3 and a retarding grid 4, inside of an objective lens 1.

FIG. 2A is a graph illustrating a magnetic field distribution caused by an objective lens 1 of the conventional in-lens type secondary electron energy analyzer shown in FIG. 1.

Here, the collimation grid 3 is placed at a position having about a half of the peak value in the right hand side on the transverse axis of a magnetic field distribution curve of the objective lens 1, i.e. at a position spaced by a distance ZC from the surface of a sample 5, and is applied with a voltage (e.g. one hundred volts) sufficiently lower than one applied at the extraction grid 2. With this configuration, when a primary electron beam e1 is irradiated on the surface of the sample 5 after being focused by the objective lens 1, the irradiation point emits a secondary electron e2. The collimation grid 3 decelerates the secondary electron e2 thus emitted from the surface of the sample 5 and accelerated to have a kinetic energy of several hundred to about a thousand electron volts by the extraction grid 2. As a result, the right hand side of the transverse axis of the magnetic field distribution curve of the objective lens 1 has a stronger refraction for secondary electrons.

FIG. 2B is a graph illustrating the trajectory of a secondary electron e2 passing through the conventional in-lens type secondary electron energy analyzer shown in FIG. 1.

For the above reason, theoretically, the secondary electron e2 emitted from the surface of the sample 5 falls perpendicularly on the retarding grid 4, thus undergoing a accurate energy retarding independent of its emission angle from the surface of the sample 5. A secondary electron detector 6 detects the secondary electron e2 that has passed through the retarding grid 4, after being separated into those capable and those incapable of passing through the retarding grid 4.

Here is a secondary electron focuses at one point (in FIG. 2B shown as the point F). This comes from the influence of an objective lens. A secondary electron is collimated after focusing at this point.

FIG. 3 is a cross-sectional view illustrating a conventional in-lens type secondary electron energy analyzer, having a plurality of spherical mesh electrodes whose center resides at the focus of an objective lens 11 for a secondary electron e2, i.e. at the point F.

A conventional in-lens type secondary electron energy analyzer of the second kind comprises an extraction electrode 12 inside of an objective lens 11, a mesh electrode 13 spherically provided outside of the objective lens 11, where these two electrodes, i.e. the extraction electrode 12 and the mesh electrode 13 are applied with the same voltage in a range between one and two kilovolts, and a retarding mesh electrode 14 provided spherically further outside of the mesh electrode 13.

With this configuration, when a primary electron beam e1 is irradiated on the surface of the sample 15 after being focused by the objective lens 11, the irradiation point emits a secondary electron e2. The objective lens 11 refocuses the secondary electron e2 thus emitted from the surface of the sample 15 at its focal point F before it is diverged, where the focal point F is also the center of these two spherical electrodes, i.e. the mesh electrode 13 and the retarding mesh electrode 14. Therefore, theoretically, the secondary electron e2 emitted from the surface of the sample 15 falls perpendicularly on the spherical surface of the retarding mesh electrode 14, thus undergoing an accurate energy retarding independent of its emission angle from the surface of the sample 15.

However, a conventional in-lens type secondary electron energy analyzer of the second kind has a disadvantage of these two spherical mesh electrodes, i.e. the mesh electrode 13 and the retarding mesh electrode 14, necessarily having larger external dimensions, because it causes the secondary electron e2 diverged from the surface of the sample 15 to converge once at the focal point F before radially diverging to fall perpendicularly on the spherical surface of the mesh electrode 13 and the retarding mesh electrode 14.

Hence, a provision of these two spherical grids, i.e. the mesh electrode 13 and the retarding mesh electrode 14, outside of the objective lens 11 requires an extra space. On the other hand, a provision of these two spherical mesh electrodes, i.e. the mesh electrode 13 and the retarding mesh electrode 14, inside of the objective lens 11 requires the objective lens 11 to have a larger magnetic circuit. In either case, a conventional in-lens type secondary electron energy analyzer of the second kind presents a difficulty in reducing the overall dimensions of the whole apparatus.

The description of the related arts continues by returning to FIG. 1.

On the other hand, a conventional in-lens type secondary electron energy analyzer of the first kind has an advantage of the three planar mesh electrodes, i.e. the extraction grid 2, the collimation grid 3 and the retarding grid 4, being small, because it causes the secondary electron e2 divergently emitted from the surface of the sample 5 and collimated by the collimation grid 3 to fall perpendicularly on the planar surface of the retarding grid 4.

Hence, a provision of these three planar mesh electrodes, i.e. the extraction grid 2, the collimation grid 3 and the retarding grid 4, requires a small space, because a collimated secondary electron e2 does not diverge randomly in all directions. Thus, it is easy to provide the three planar mesh electrodes, i.e. the extraction grid 2, the collimation grid 3 and the retarding grid 4, inside of the objective lens 1, and the secondary electron detector 6 need only be provided outside of the objective lens 1.

As a result, a conventional in-lens type secondary electron energy analyzer of the first kind has an advantage of having overall dimensions smaller than one of the second kind. Additionally, it has a further advantage that the fabrication of a planer mesh electrode is much simpler and more precise than that of a spherical mesh electrode.

Yet, a conventional in-lens type secondary electron energy analyzer of the first kind has a following disadvantage in shortening the focal length for reducing the dimensions of a beam aperture by further reducing the aberration of the objective lens 1.

First, since an LSI package partly uses a magnetic material, a generic electron beam apparatus for a voltage measurement has a limit on the intensity of a leakage magnetic field on the surface of the sample 5, because of the increase of an astigmatism caused by the magnetic material.

A lens focal length is, simply put, proportionate to the extent of the magnetic field distribution and inversely proportionate to the square of the maximum value of a magnetic field distribution. Because of the magnetic nature of the LSI package, it becomes necessary to have the intensity of the magnetic distribution of the objective lens 1 to be limited. To shorten the focal length, this reduces the extent of magnetic distribution contributing the collimation of a secondary electron e2. Hence, a secondary electron e2 needs to have its speed (i.e. kinetic energy) lowered sufficiently to be able to be collimated.

Meanwhile, in conducting the voltage measurement of an internal wire of an LSI with an insulation cover film, because of a need for preventing the insulation cover film from being charged up, the voltage applied at the extraction grid 2 for accelerating a secondary electron e2 must be lowered by several hundred volts.

As a result, an optimal voltage for the collimation grid 3, which is almost proportionate to a voltage Ve applied to the extraction grid 2, draws dramatically down to a range between fifteen volts and twenty volts.

For this reason, when the voltage at the collimation grid 3 draws down to a range between fifteen volts and twenty volts, a variation of the sample voltage having an order of magnitude at several tens of volts generated in the case of an insulation cover film, causes the trajectory of a secondary electron e2 inside of the secondary electron analyzer to be changed greatly, which produces a large diversion from a collimation condition enough to disable a precise energy retarding.

FIGS. 4A through 4F show a concrete example of such problems in a conventional in-lens type secondary electron energy analyzer of the first kind.

FIG. 4A is a graph illustrating the relative positions of the surface of the sample 5, the extraction grid 2, the collimation gird 3 and the retarding grid 4 of the conventional in-lens type secondary electron energy analyzer of the first type shown in FIG. 1.

FIG. 4B is a graph illustrating the trajectory of a secondary electron e2 passing through the conventional in-lens type secondary electron energy analyzer of the first type shown in FIG. 1, when a sample voltage Vsp is minus twenty 20 volts.

FIG. 4C is a graph illustrating the trajectory of a secondary electron e2 passing through the conventional in-lens type secondary electron energy analyzer of the first type shown in FIG. 1, when a sample voltage Vsp is zero volts.

FIG. 4D is a graph illustrating the trajectory of a secondary electron e2 passing through the conventional in-lens type secondary electron energy analyzer of the first type shown in FIG. 1, when a sample voltage Vsp is twenty volts.

FIG. 4E is a graph illustrating an axial magnetic flux density distribution on an optical axis Z.

FIG. 4F is a graph illustrating an electric potential distribution on an optical axis Z.

It is assumed here that voltages Ve applied at the extraction grid 4 and Vc applied at the collimation grid 3 are three hundred seventy volts and twenty volts, respectively, and that the voltage Vr applied at the retarding grid 4 is set equal to the sample voltage Vsp applied to the sample 5. Because the FWHM (full width of half maximum) of the magnetic field distribution is set to about a half of the convention, the focal length is shortened, thereby reducing the aberration. Yet, the magnetic field is only effective as a lens in focusing a secondary electron e2 to a position (the focal point F in FIGS. 4B, 4C and 4D) for focusing a secondary electron e2 midway between the extraction grid 2 and the collimation grid 3.

Accordingly, although FIG. 4C shows a case in which it is possible to collimate a secondary electron e2 when the sample voltage Vsp is zero volts, it is impossible to collimate a secondary electron e2, i.e. to inject a secondary electron e2 perpendicularly on the retarding grid 4, when the sample voltage Vsp is minus twenty volts as in a case shown in FIG. 4B or when the sample voltage Vsp is twenty volts as in a case shown in FIG. 4D.

Especially, because FIG. 4F shows a case in which the electric potential at the position of the collimation grid 3 on the optical axis Z (the potential at a point C) is not more than twenty volts when the sample voltage Vsp is twenty volts as in a case shown in FIG. 4D, a secondary electron e2 emitted from the sample 5 applied with the sample voltage Vsp at twenty volts may not be able to pass through point C in the worst case.

As well, it is apparent that a collimation is effective only between the collimation grid 3 and the retarding grid 4 when the sample voltage Vsp is zero volts, and that this is due to the effect of a nonuniform electrical field distribution actually in place despite the theoretical presence of a uniform electrical field, instead of due to the effect of a magnetic field.

FIG. 5A is a graph illustrating an integrated energy spectrum of secondary electron (so called S-curve) obtained by the conventional in-lens type secondary electron energy analyzer shown in FIG. 1, when sample voltages Vsp are zero volts and three volts.

FIG. 5B is a graph illustrating a S-curve obtained by the conventional in-lens type secondary electron energy analyzer shown in FIG. 1, when sample voltages Vsp are ten volts and thirteen volts.

These S-curves are obtained by having the secondary electron detector 6 detect a secondary electron e2 passing through the retarding grid 4 when the voltage applied to the retarding grid 4 is changed from minus twenty volts to twenty volts. It is necessary here for a secondary electron e2 to fall perpendicularly on the retarding grid 4, which decelerates, halts or even returns a secondary electron e2. A secondary electron e2 may not pass through the retarding grid 4 even if it does not halt to a complete stop, when a secondary electron e2 does not fall perpendicularly on the retarding grid 4.

This is because the retarding grid 4 does not change the speed of a secondary electron e2 vectored parallelly to the planar surface of the retarding grid 4, even though the retarding grid 4 reduces the speed of a secondary electron e2 vectored perpendicularly to the planar surface of the retarding grid 4.

This means that a secondary electron e2 having a sufficient speed (kinetic energy) to pass through the retarding grid 4 may not pass through the retarding grid 4 when its trajectory is not perpendicular to the planar surface of the retarding grid 4. This should be interpreted as a failure in correctly analyzing the kinetic energy of a secondary electron e2.

That is, a conventional in-lens type secondary electron energy analyzer of the first kind can correctly analyze the kinetic energy of a secondary electron e2 only when a secondary electron e2 falls perpendicularly on the retarding grid 4 after having been collimated properly, because the S-curve has a shape of integrating the energy distribution of a secondary electron e2.

FIG. 5A illustrates a three volt shift, which indicates a correct energy retarding. But FIG. 5B illustrates an energy retarding curve far from a proper one that should be obtained by integrating the energy distribution of a secondary electron e2, which disables a shift between two curves, i.e. a voltage shift, to be measured.

That is, the conventional in-lens type secondary electron energy analyzer of the first kind (shown in FIG. 1) having a plurality of planar grids (mesh electrodes) for a magnetic field collimation of a secondary electron e2, has its collimation grid 3 slow down the speed of a secondary electron e2 in a vicinity of the magnetic distribution generated by a magnetic field lens, and enables a secondary electron e2 to be collimated by adjusting the effect of a magnetic field distribution for a secondary electron e2.

However, a narrow magnetic field distribution causes a secondary electron e2 to once converge at a point devoid of a substantial magnetic distribution. Theoretically, a mere posterior adjustment of the speed of a secondary electron e2 is not sufficient to collimate it.

It is conceivable to newly add a magnetic field distribution for collimating a secondary electron e2 shown as a dashed line in FIG. 4E. Yet, because the newly added magnetic distribution affects a primary electron beam e1 greatly, this brings about an effectual spread of a lens magnetic distribution and fails to reduce an aberration. It is also conceivable, as another method, to shift the position of the collimation grid 3 closer to the surface of the sample 5, thus slowing down the speed of a secondary electron e2 in a range having a magnetic field distribution, thereby improving the collimation performance. But a lower voltage at the main part of a magnetic field distribution increases a lens aberration.

SUMMARY OF THE INVENTION

This invention aims at facilitating the collimation control of a secondary electron e2 even when an objective lens has a narrow magnetic field distribution and at improving the accuracy in a voltage measurement even when a lower extraction voltage Ve is applied to an extraction electrode for preventing a sample from being charged up.

This invention pertains to an electron beam apparatus comprising, inside of an objective lens for focussing a primary electron beam e1 and irradiating it on a sample surface, a secondary electron energy analyzer for analyzing, through a decelerating electrical field formed by a retarding grid (mesh electrode) having a planar surface, the energy of a secondary electron e2 emitted from a point on the sample surface at which the primary electron beam e1 is irradiated.

The secondary electron energy analyzer comprises a collimation unit for forming one or more electrostatic lenses by a nonuniform electrical field distribution and for having an electrostatic lens collimate the trajectory of a secondary electron e2 for an injection into the retarding grid (mesh electrode).

More specifically, the collimation unit comprises at least three cylindrical electrodes positioned between a sample surface and the retarding grid (mesh electrode) and numbered first, second and third from the one closest to the sample surface. In this case, an external power supply module applies an appropriate voltage to each of these cylindrical electrodes for having each duo of neighboring cylindrical electrodes form an electrostatic lens.

Here, for example, each of first, second and third cylindrical electrodes numbered as above is formed as an electrode having the following ability: The first cylindrical electrode is positioned close to the sample surface as the extraction electrode for extracting out a secondary electron e2 and accelerating it. The second cylindrical electrode is positioned next to the first cylindrical electrode as an acceleration electrode for further accelerating the speed of a secondary electron e2 extracted by the first cylindrical electrode and collimating a secondary electron e2. The third cylindrical electrode is positioned in between the second cylindrical electrode and the retarding mesh electrode as a collimation electrode for decelerating the speed of a secondary electron e2 accelerated by the second cylindrical electrode and for collimating it for its injection into the retarding mesh electrode.

The power supply module properly sets a voltage applied at each cylindrical electrode, such that one or more electrostatic lenses enable the trajectory of a secondary electron e2 to be collimated for its perpendicular injection into the retarding grid (mesh electrode).

For instance, it is desirable to apply to the second cylindrical electrode a constant positive high voltage not less than that applied to the first cylindrical electrode.

As well, it is desirable to render variable the voltage applied at the first cylindrical electrode depending on whether the sample surface is with or without an insulation cover film and to set as the voltage applied at the third cylindrical electrode an appropriate voltage capable of collimating the trajectory of a secondary electron e2 in accordance with the voltage applied at the first cylindrical electrode.

The shape and size of each cylindrical electrode or its configuration can be set appropriately.

Further, this invention configures a secondary electron energy analyzer to include a plurality of electrostatic lenses for actively generating a nonuniform electrical field distribution e.g. at a skirt of a magnetic field distribution, instead of generating a uniform electrical field mainly for decelerating a secondary electron e2, thereby forming an electrostatic lens. More specifically, as described earlier, the collimation unit for collimating a secondary electron e2 by forming such an electrostatic lens can adopt a configuration of arranging a plurality of cylindrical electrodes between the sample surface and the retarding grid (mesh electrode), such that these cylindrical electrodes act more effectively as a lens.

BRIEF DESCRIPTION OF THE DRAWINGS

One skilled in the art can easily understand additional features and objects of this invention from the description of the preferred embodiments and some of the attached drawings. In the drawings:

FIG. 10A is a graph illustrating the relative positions of two cylindrical electrodes K1 and K2 forming an electrostatic lens;

FIG. 10B is a schematic diagram illustrating the trajectory of a secondary electron e2 passing through the electrostatic lens formed by two cylindrical electrodes K1 and K2;

FIG. 10C is a graph illustrating the lens characteristics of the electrostatic lens formed by two cylindrical electrodes K1 and K2;

DESCRIPTION OF THE PREFERRED EMBODIMENTS

Figure 1:
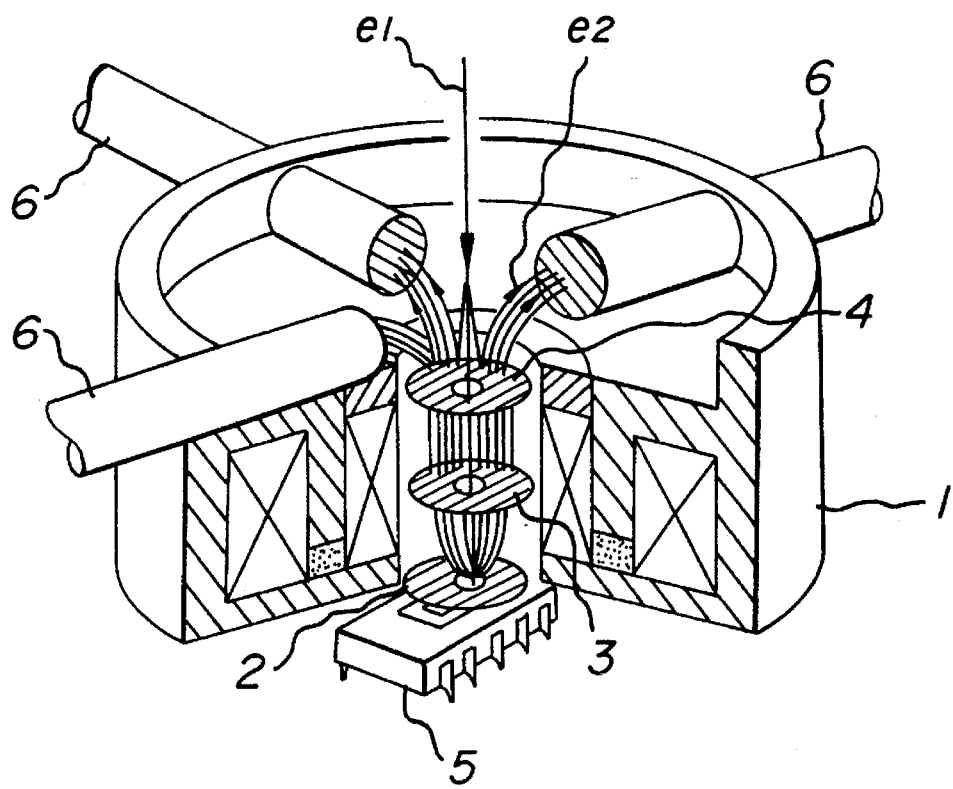
FIG. 1 is a squint view illustrating a cutaway of a conventional in-lens type secondary electron energy analyzer, having a plurality of planar mesh electrodes for a magnetic field collimation of a secondary electron e2.
Figure 2A:
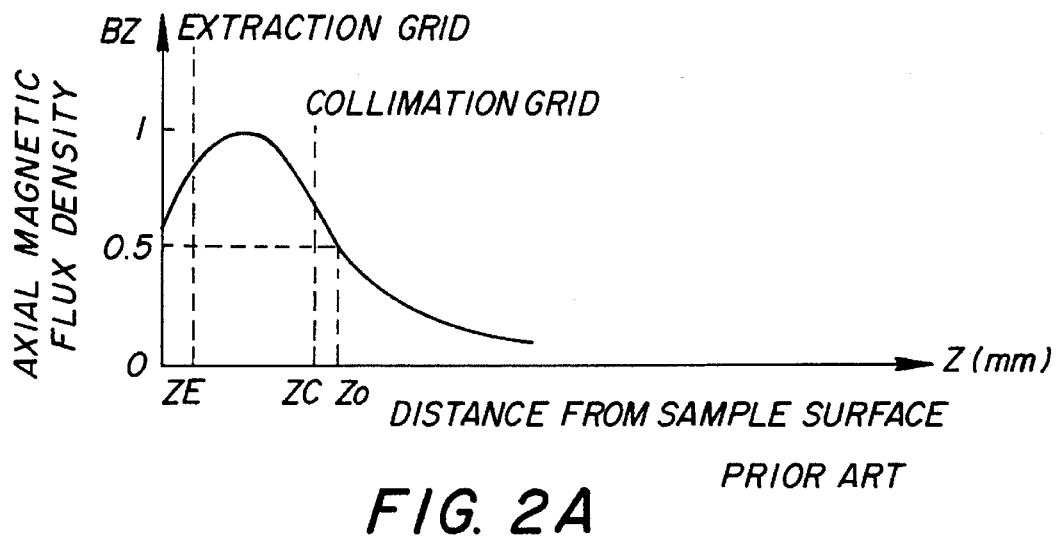
FIG. 2A is a graph illustrating a magnetic field distribution caused by an objective lens 1 of the conventional in-lens type secondary electron energy analyzer shown in FIG. 1.
Figure 2B:
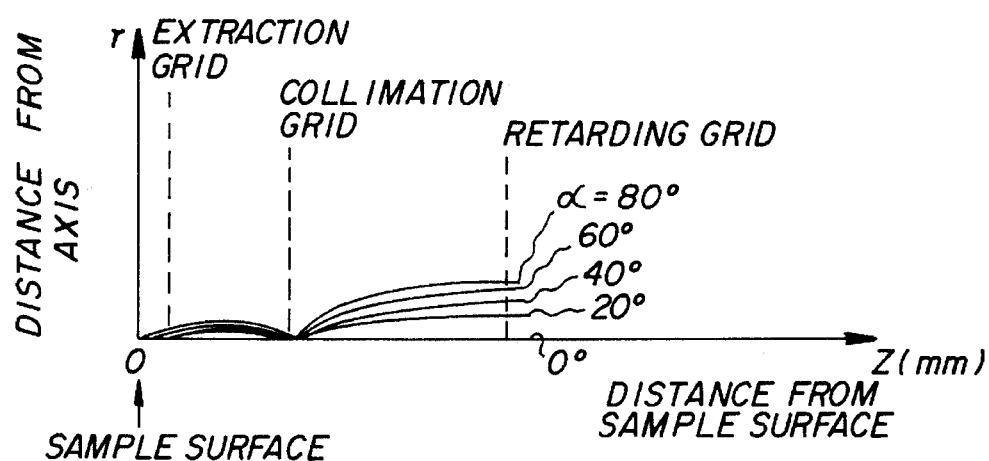
FIG. 2B is a graph illustrating the trajectory of a secondary electron e2 passing through the conventional in-lens type secondary electron energy analyzer shown in FIG. 1.
Figure 3:
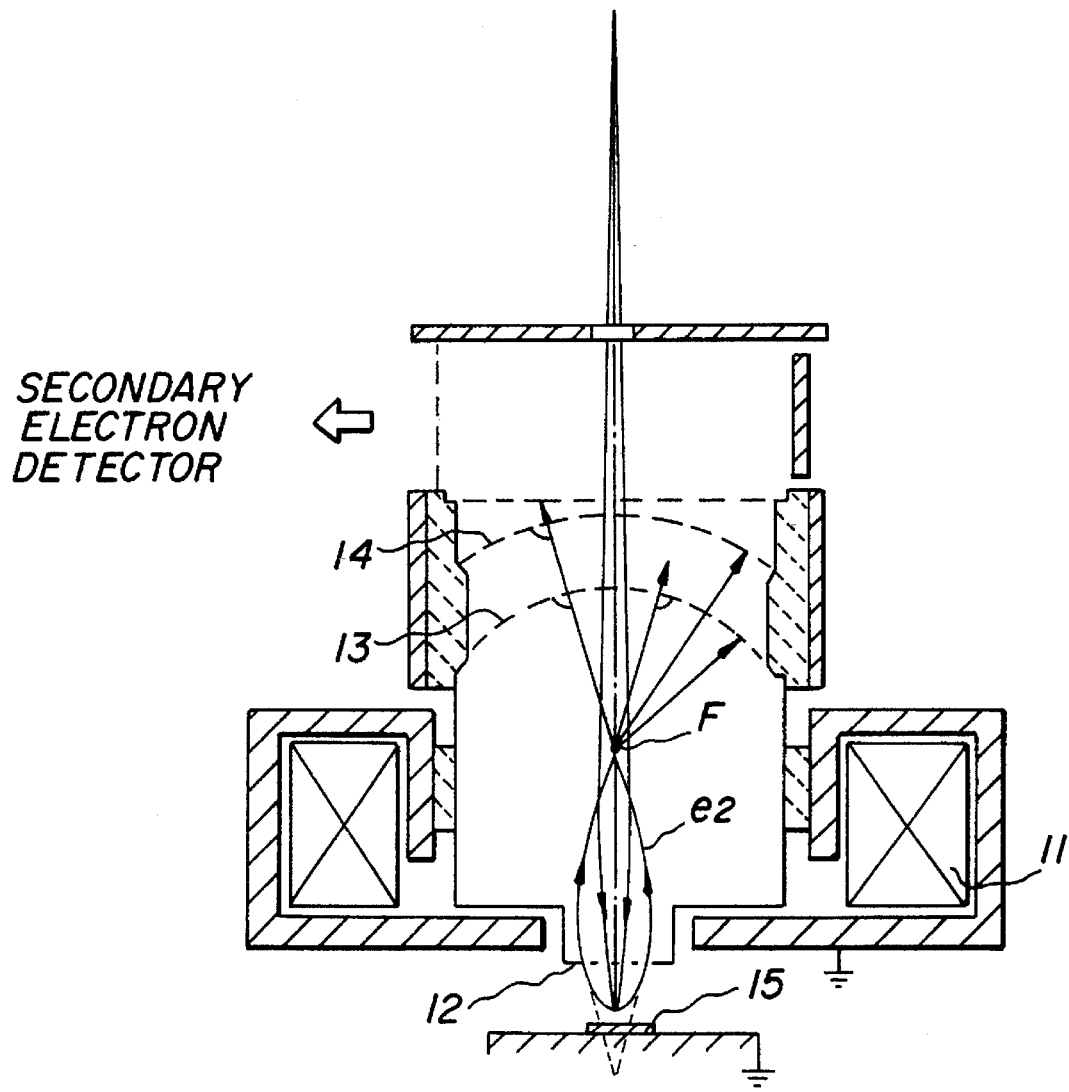
FIG. 3 is a cross-sectional view illustrating a conventional in-lens type secondary electron energy analyzer, having a plurality of spherical mesh electrodes whose center resides at the focus of an objective lens 11 for secondary electrons (at the point F)
Figure 6A:
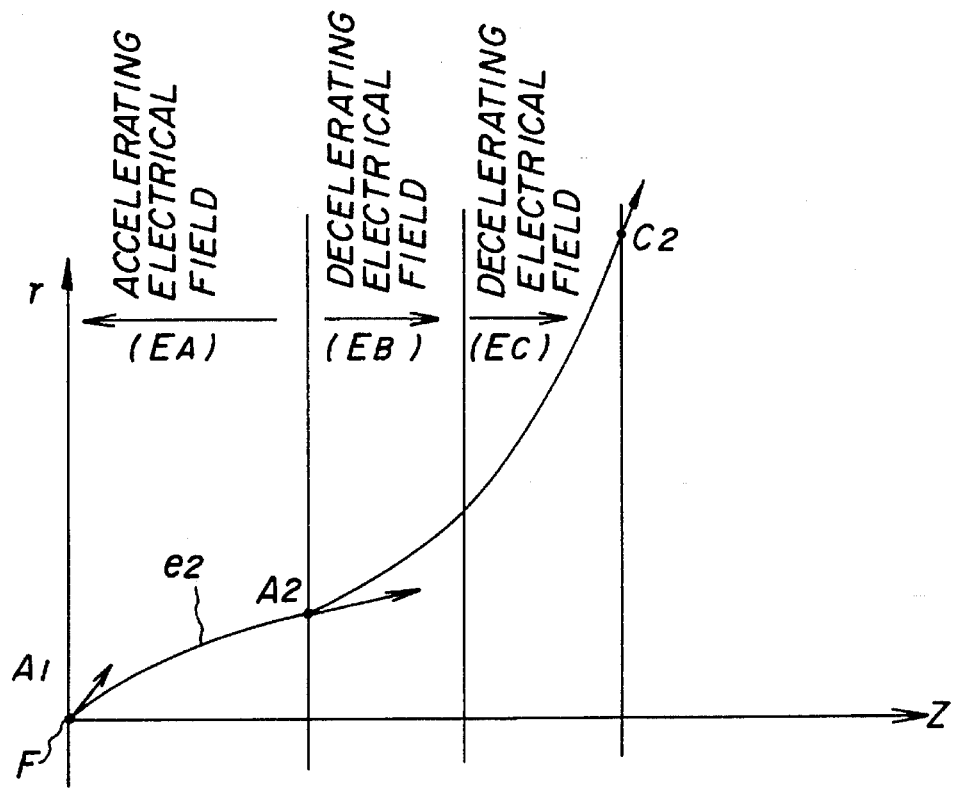
FIG. 6A is a graph illustrating the trajectory of a secondary electron e2 diverging from a focal point F by passing through a uniform accelerating electrical field EA and uniform decelerating electrical fields EB and EC with little magnetic field distribution in the conventional in-lens type secondary electron energy analyzer shown in FIG. 1.

FIG. 6A is a graph illustrating the trajectory of a secondary electron e2 diverging from a focal point F by passing through a uniform accelerating electrical field EA and uniform decelerating electrical fields EB and EC with little magnetic field distribution in the conventional in-lens type secondary electron energy analyzer shown in FIG. 1.

Described below is an explanation about the inability of a uniform electrical field to collimate a secondary electron e2 as in the prior art.

It is assumed here that the magnetic field distribution of an objective lens has a sharp peak for shortening the focal length.

Figure 4A:
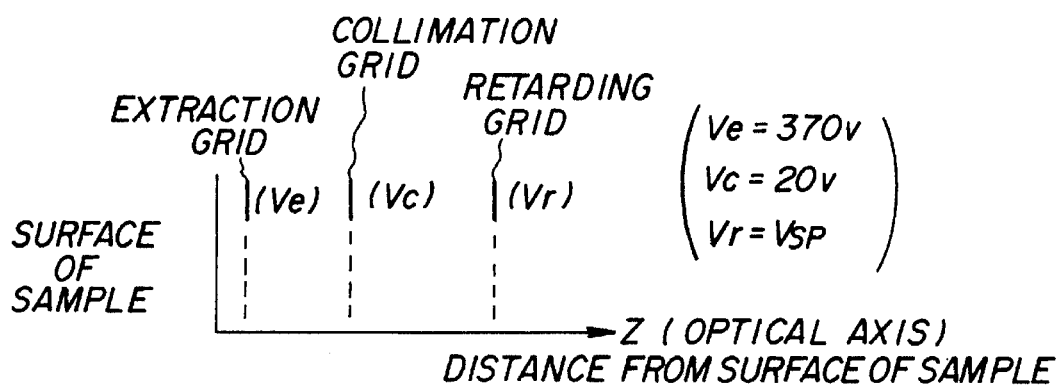
FIG. 4A is a graph illustrating the relative positions of the surface of the sample 5, the extraction grid 2, the collimation grid 3 and the retarding grid 4 of the conventional in-lens type secondary electron energy analyzer of the first type shown in FIG. 1.
Figure 4B:
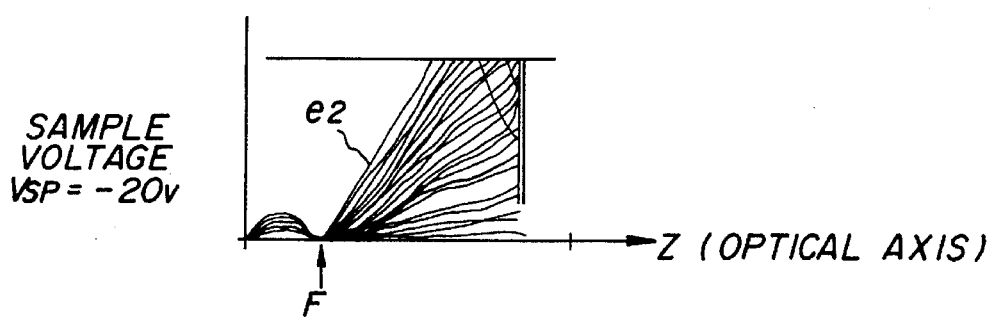
FIG. 4B is a graph illustrating the trajectory of a secondary electron e2 passing through the conventional in-lens type secondary electron energy analyzer of the first type shown in FIG. 1, when a sample voltage Vsp is minus twenty volts.
Figure 4C:
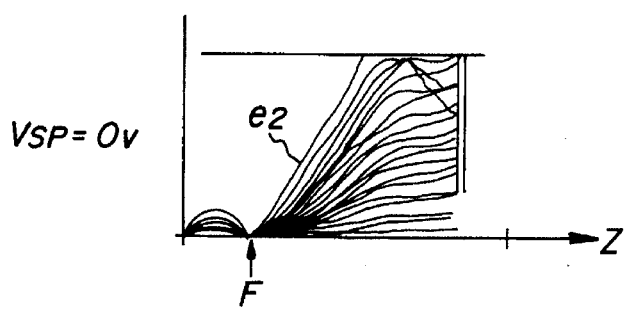
FIG. 4C is a graph illustrating the trajectory of a secondary electron e2 passing through the conventional in-lens type secondary electron energy analyzer of the first type shown in FIG. 1, when a sample voltage Vsp is zero volts.
Figure 4D:
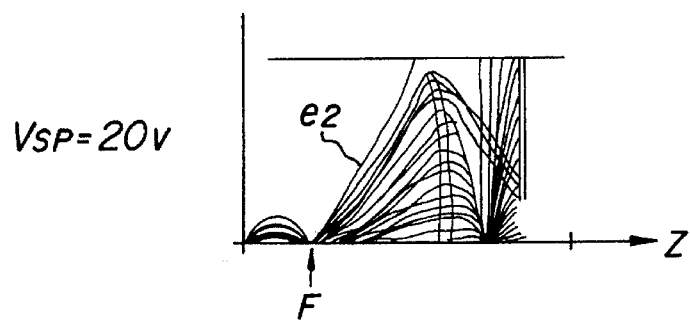
FIG. 4D is a graph illustrating the trajectory of a secondary electron e2 passing through the conventional in-lens type secondary electron energy analyzer of the first type shown in FIG. 1, when a sample voltage Vsp is twenty volts.
Figure 4E:
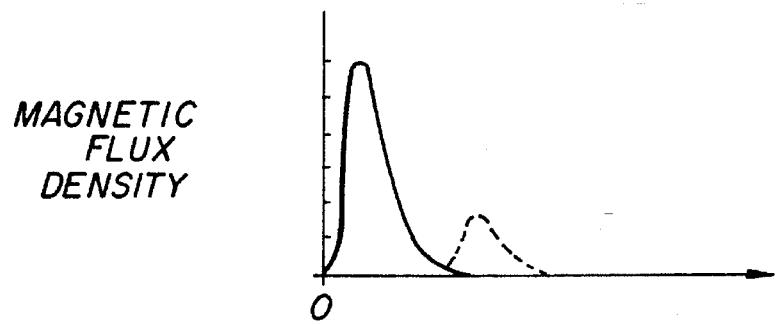
FIG. 4E is a graph illustrating an axial magnetic flux destiny distribution on an optical axis Z.
Figure 4F:
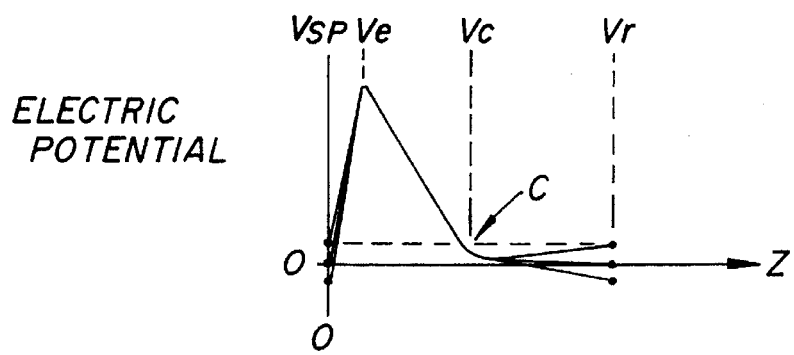
FIG. 4F is a graph illustrating an electric potential distribution on an optical axis Z.
Figure 5A:
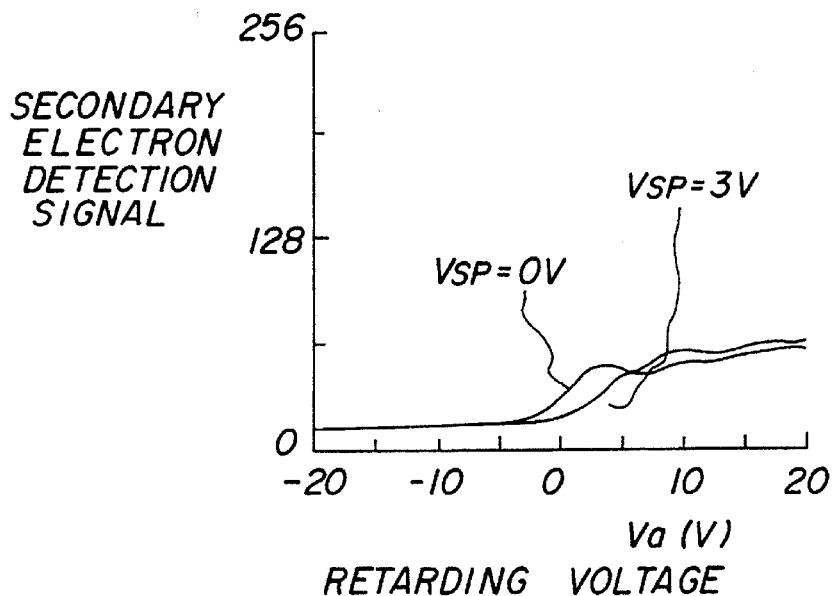
FIG. 5A is a graph illustrating an integrated energy spectrum of secondary electron (so-called S-curve) obtained by the conventional in-lens type secondary electron energy analyzer shown in FIG. 1, when sample voltages Vsp are zero volts and three volts.
Figure 5B:
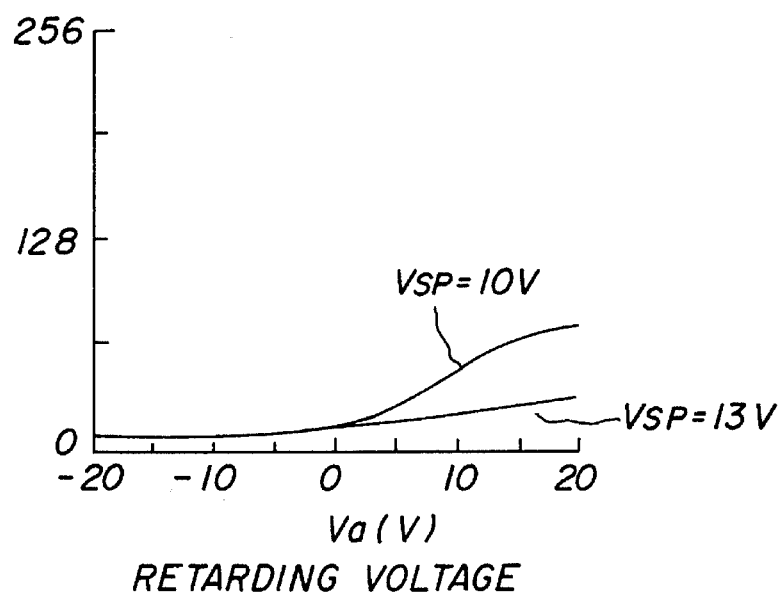
FIG. 5B is a graph illustrating an S-curve obtained by the conventional in-lens type secondary electron energy analyzer shown in FIG. 1, when sample voltages Vsp are ten volts and thirteen volts.

A secondary electron e2 passing through a lens magnetic field has a trajectory of always once converging on a focal point F on an optical axis Z and then diverging radially, as shown in FIGS. 4B, 4C and 4D. This is due to the inevitable existence of a magnetic field distribution necessary for focusing a primary electron beam e1 on a sample surface. Accordingly, described below is only the effect on a secondary electron e2 at a position on and after the focal point F, i.e. not nearer than the focal point F from the sample surface.

As shown in FIG. 6A, an accelerating electrical field EA gradually collimates a secondary electron e2 diverging from the focal point F, because the velocity component in the direction of the optical axis Z increases but the velocity component in the direction of the radius r remains exactly the same. On the other hand, decelerating electrical fields EB and EC can never collimate a secondary electron e2 but cause a secondary electron e2 further diverge from the focal point F, because the speed component in the direction of the optical axis Z decreases but the speed component in the direction of the radius r remains exactly the same. Arrows herein represent velocity vectors of a secondary electron e2.

Figure 6D:
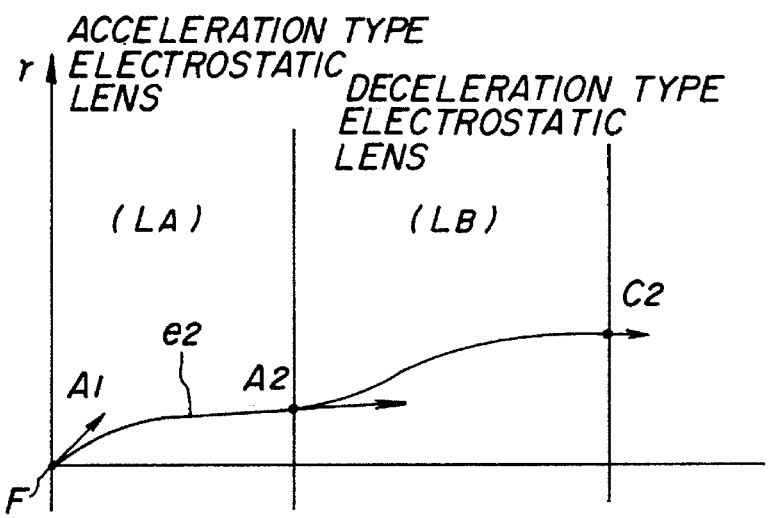
FIG. 6D is a graph illustrating the trajectory of a secondary electron e2 diverging from a focal point F by passing through a non-uniform accelerating electrical field created by the acceleration type electrostatic lens LA shown in FIG. 6B and a non-uniform decelerating electrical field created by the deceleration type electrostatic lens LB shown in FIG. 6C, both in an in-lens type secondary electron energy analyzer of this invention.
Figure 6B:
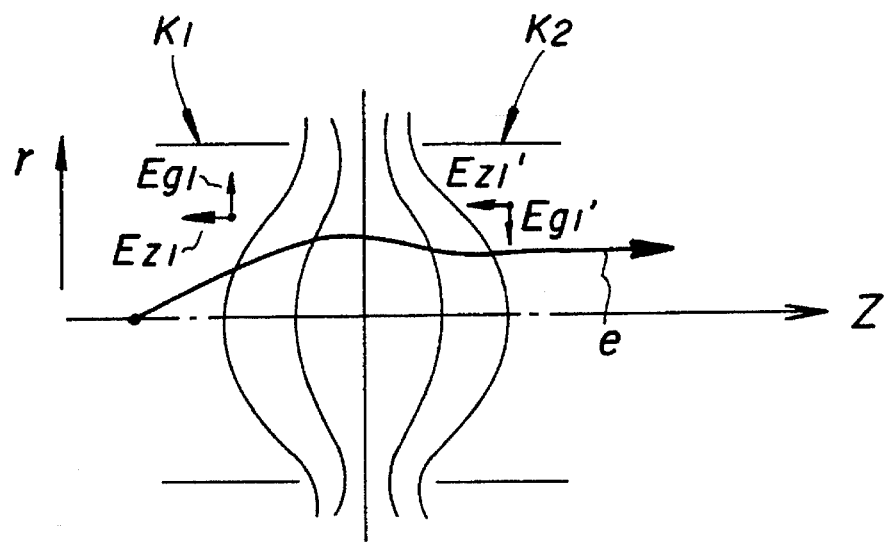
FIG. 6B is a graph illustrating isoelectric potential lines and the trajectory of a secondary electron e2 passing through a predetermined non-uniform accelerating electrical field created by an acceleration type electrostatic lens LA in an in-lens type secondary electron energy analyzer of this invention.

FIG. 6B is a graph illustrating isoelectric lines and the trajectory of a secondary electron e2 passing through a predetermined non-uniform accelerating electrical field created by an acceleration type potential electrostatic lens LA in an in-lens type secondary electron energy analyzer of this invention.

The acceleration type electrostatic lens LA formed between two [2 v] cylindrical electrodes K1 and K2 increases the kinetic energy of the secondary electron e2 by raising its speed.

A radial electrical field $E\rho 1$ pointing outward, i.e. away from the optical axis Z, applies an inward force to the secondary electron e2 injected into the acceleration type electrostatic lens LA, thereby refracting its trajectory inward, i.e. towards the optical axis Z.

Then, in an opposite manner, a radial electrical field $E\rho 1'$ pointing inward, i.e. towards the optical axis Z, applies an outward force to the secondary electron e2 trajected past the midpoint between the two [2 v] cylindrical electrodes K1 and K2 of the acceleration type electrostatic lens LA, thereby refracting its trajectory outward, i.e. away from the optical axis Z.

Yet, because the electron with higher kinetic energy after having been accelerated is less prone to be refracted, the degree of its outward refraction by the latter, i.e. radial electrical field $E\rho 1'$, is smaller than that of its inward refraction by the former, i.e. radial electrical field $E\rho 1$. As a result, the acceleration type electrostatic lens LA causes the secondary electron e2 to converge towards the optical axis Z, thereby collimating it.

Figure 6C:
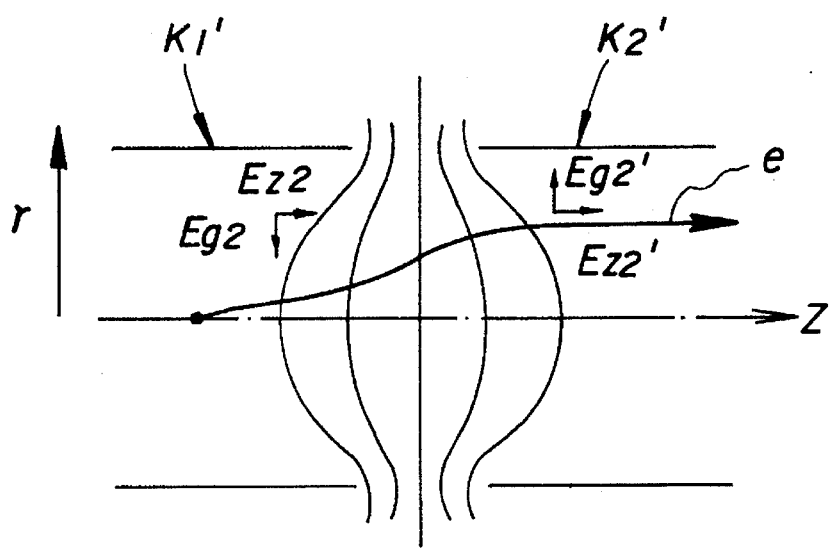
FIG. 6C is a graph illustrating isoelectric potential lines and the trajectory of a secondary electron e2 passing through a predetermined non-uniform decelerating electrical field created by a deceleration type electrostatic lens LB in an in-lens type secondary electron energy analyzer of this invention.

FIG. 6C is a graph illustrating isoelectric potential lines and the trajectory of a secondary electron e2 passing through a predetermined non-uniform decelerating electrical field created by a deceleration type electrostatic lens LB in an in-lens type secondary electron energy analyzer of this invention.

The deceleration type electrostatic lens LB formed between two cylindrical electrodes K1' and K2' reduces the kinetic energy of the secondary electron e2 by slowing down its speed.

A radial electrical field $E\rho 2$ pointing inward, i.e. towards the optical axis Z, applies an outward force to the secondary electron e2 injected into the deceleration type electrostatic lens LB, thereby refracting its trajectory outward, i.e. away from the optical axis Z.

Then, in an opposite manner, a radial electrical field $E\rho 2'$ pointing outward, i.e. away from the optical axis Z, applies an inward force to the secondary electron e2 trajected past the midpoint between the two cylindrical electrodes K1' and K2' of the deceleration type electrostatic lens LB, thereby refracting its trajectory inward, i.e. towards the optical axis Z.

Yet, because the electron with lower kinetic energy after having been decelerated is more prone to be refracted, the degree of its outward refraction by the former, i.e. radial electrical field Ep2, is smaller than that of its inward refraction by the latter, i.e. radial electrical field Ep2'. As a result, the acceleration type electrostatic lens LA causes the secondary electron e2 to converge towards the optical axis Z, thereby collimating it.

FIG. 6D is a graph illustrating the trajectory of a secondary electron e2 diverging from a focal point F by passing through a non-uniform accelerating electrical field created by the acceleration type electrostatic lens LA shown in FIG. 6B and a non-uniform decelerating electrical field created by the deceleration type electrostatic lens LB shown in FIG. 6C, both in an in-lens type secondary electron energy analyzer of this invention.

Although both the acceleration type electrostatic lens LA shown in FIG. 6B and the deceleration type electrostatic lens LB shown in FIG. 6C can collimate a secondary electron e2, FIG. 6D shows an example of positioning the former first and the latter second along the trajectory of a secondary electron e2.

In this example, the acceleration type electrostatic lens LA slightly converges the secondary electron e2 diverging from a focal point F. What is different in this example from the one shown in FIG. 6A is that the acceleration type electrostatic lens LA has caused the secondary electron e2 to have a lower velocity component in the direction of the radius r before reaching a transition point A2 from an accelerating electrical field to a decelerating electrical field.

Then, the deceleration type electrostatic lens LB further converges for a complete collimation the secondary electron e2 slightly diverging from the transition point A2.

In an actual use, an appropriate adjustment of the intensity of the deceleration type electrostatic lens LB while holding that of the acceleration type electrostatic lens LA constant, or vise versa, enables an ideal collimation.

It is not always necessary to form both the acceleration type electrostatic lens LA and the deceleration type electrostatic lens LB for a joint use. Even a single use of the latter enables a collimation to be controlled better than a prior art.

Figure 7A:
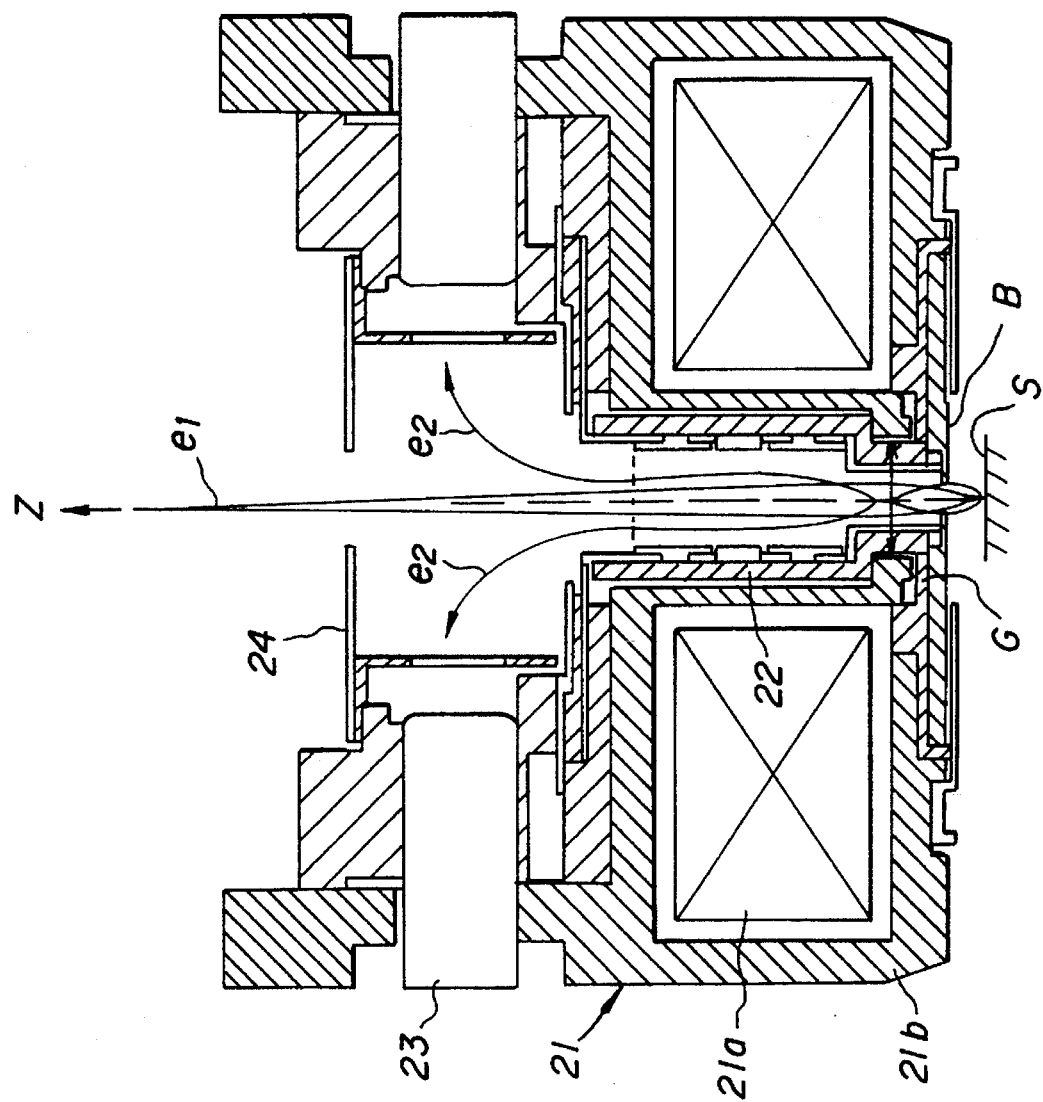
FIG. 7A is a cross-sectional view of the pertinent part of an electron beam apparatus pursuant to a first embodiment of this invention.

FIG. 7A is a cross-sectional view of the pertinent part of an electron beam apparatus pursuant to a first embodiment of this invention.

Figure 7B:
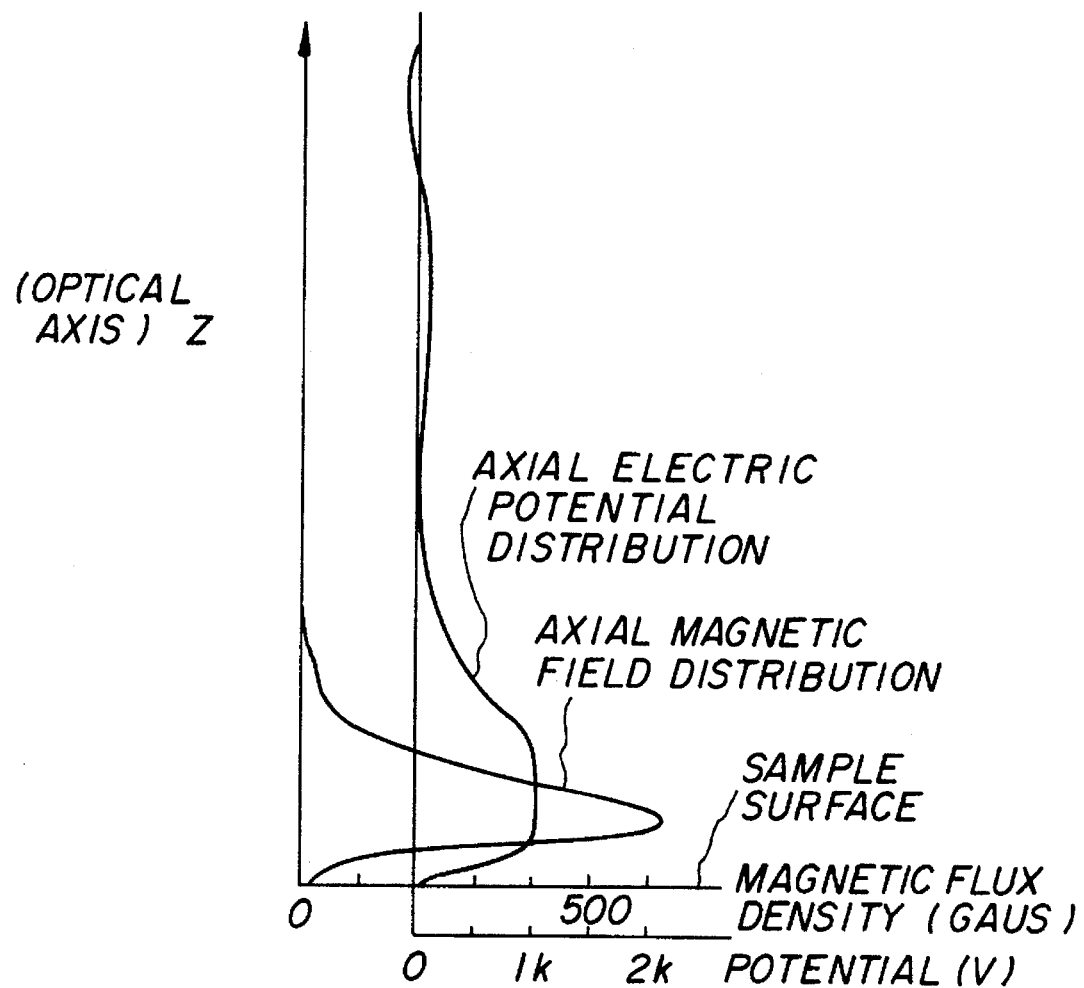
FIG. 7B is a diagram illustrating an axial electric potential distribution and an axial magnetic field distribution inside of the electron beam apparatus shown in FIG. 7A.

FIG. 7B is a diagram illustrating an axial electric potential distribution and an axial magnetic field distribution inside of the electron beam apparatus shown in FIG. 7A.

An electron beam apparatus pursuant to a first embodiment structures a magnetic objective lens 21 to converge a primary electron beam e1 for an irradiation on a sample surface S. The magnetic objective lens 21 comprises a coil 21a arranged in a ring form and a magnetic circuit surrounding the coil 21a. A bore diameter B and a gap G of the magnetic circuit 21b of the magnetic objective lens 21 are set small. As a result, the FWHM of axial magnetic field distribution is small with an approximate dimension of five millimeters.

The electron beam apparatus further comprises, inside of the magnetic objective lens 21, a cylindrical secondary electron energy analyzer 22 for analyzing the energy of a secondary electron e2 emitted from a point on the sample surface S at which a primary electron beam e1 is irradiated.

Additionally, the electron beam apparatus comprises, over and outside of the magnetic objective lens 21, a secondary electron detector 23 for detecting a secondary electron e2 having passed through the cylindrical secondary electron energy analyzer 22, and a reflection electrode 24 for injecting into the secondary electron detector 23 a secondary electron e2 having passed through the cylindrical secondary electron energy analyzer 22.

Figure 8:
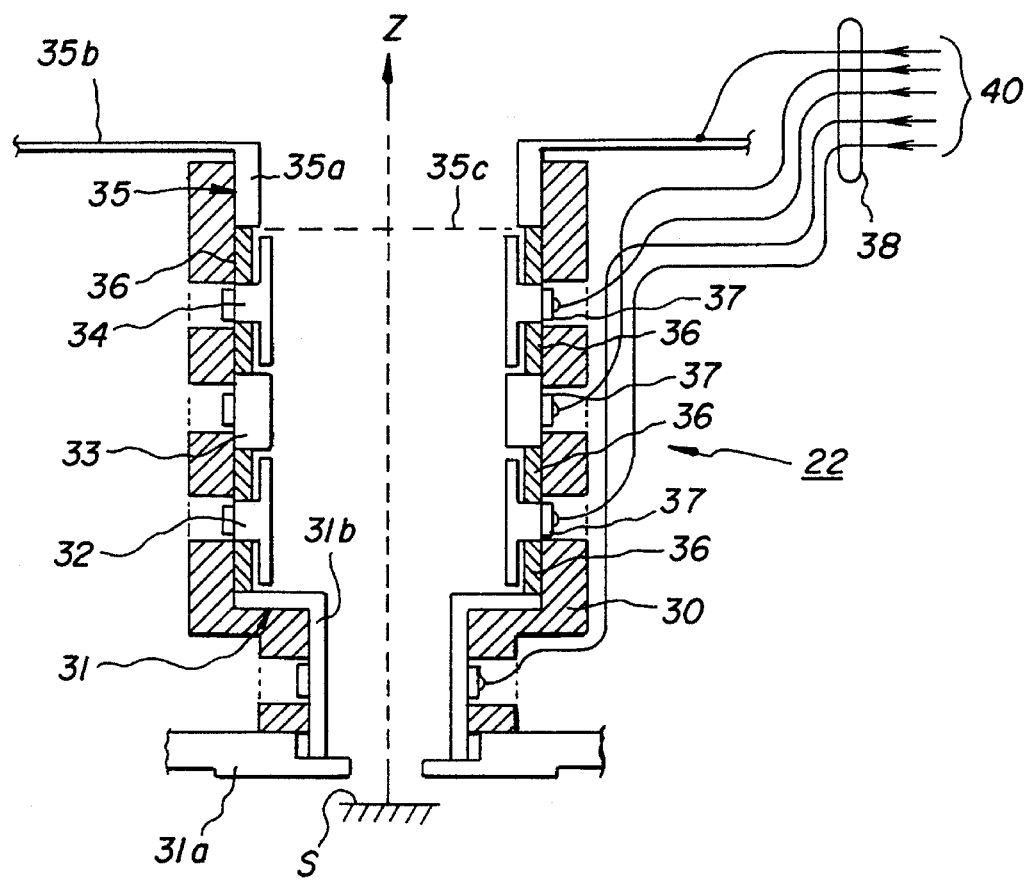
FIG. 8 is an enlarged cross-sectional view of the pertinent part of the electron beam apparatus shown in FIG. 7A.

FIG. 8 is an enlarged cross-sectional view of the pertinent part of the electron beam apparatus shown in FIG. 7A.

The cylindrical secondary electron energy analyzer 22 comprises a first cylindrical electrode 31, a second cylindrical electrode 32, a third cylindrical electrode 33, a fourth cylindrical electrode 34 and a planar retarding mesh electrode 35, where cylindrical spacers 36 separate each neighboring ones of those electrodes from the other. A cylindrical supporter 30 made of an insulation material supports all of these members as a whole unit and is put at the center of the magnetic objective lens 21. The cylindrical spacer 36 made of a conductive material has a high resistance value in a range between ten megohms and twenty megohms for preventing a charge-up by an electron sneaking in from a gap between electrodes.

The first cylindrical electrode 31 is an extraction electrode for extracting from a sample surface S a secondary electron e2 for an acceleration. It comprises a disk electrode 31a operating also as a magnetic core and a cylindrical electrode 31b provided upward on the disk electrode 31a.

The second cylindrical electrode 32 provided next to the first cylindrical electrode 31 is an acceleration electrode for further accelerating and collimating a secondary electron e2 extracted by the first cylindrical electrode 31.

The third cylindrical electrode 33 provided next to the second cylindrical electrode 32 is for decelerating and further collimating a secondary electron e2 accelerated by the second cylindrical electrode 32.

The fourth cylindrical electrode 34 is not an electrode essential to this invention, but is provided here for a reason described later.

The planar regarding mesh electrode 35 comprises a cylindrical electrode 35a provided next to the fourth cylindrical electrode 34, a fixation electrode 35b and a mesh electrode 35c fixed between the cylindrical electrode 35a and the cylindrical spacer 36.

A power supply module 40 (Refer to FIG. 9.) provided outside of the magnetic objective lens 21 applies a desired voltage to each electrode via a lead wire 38 and an electrical connector 37.

Figure 9:
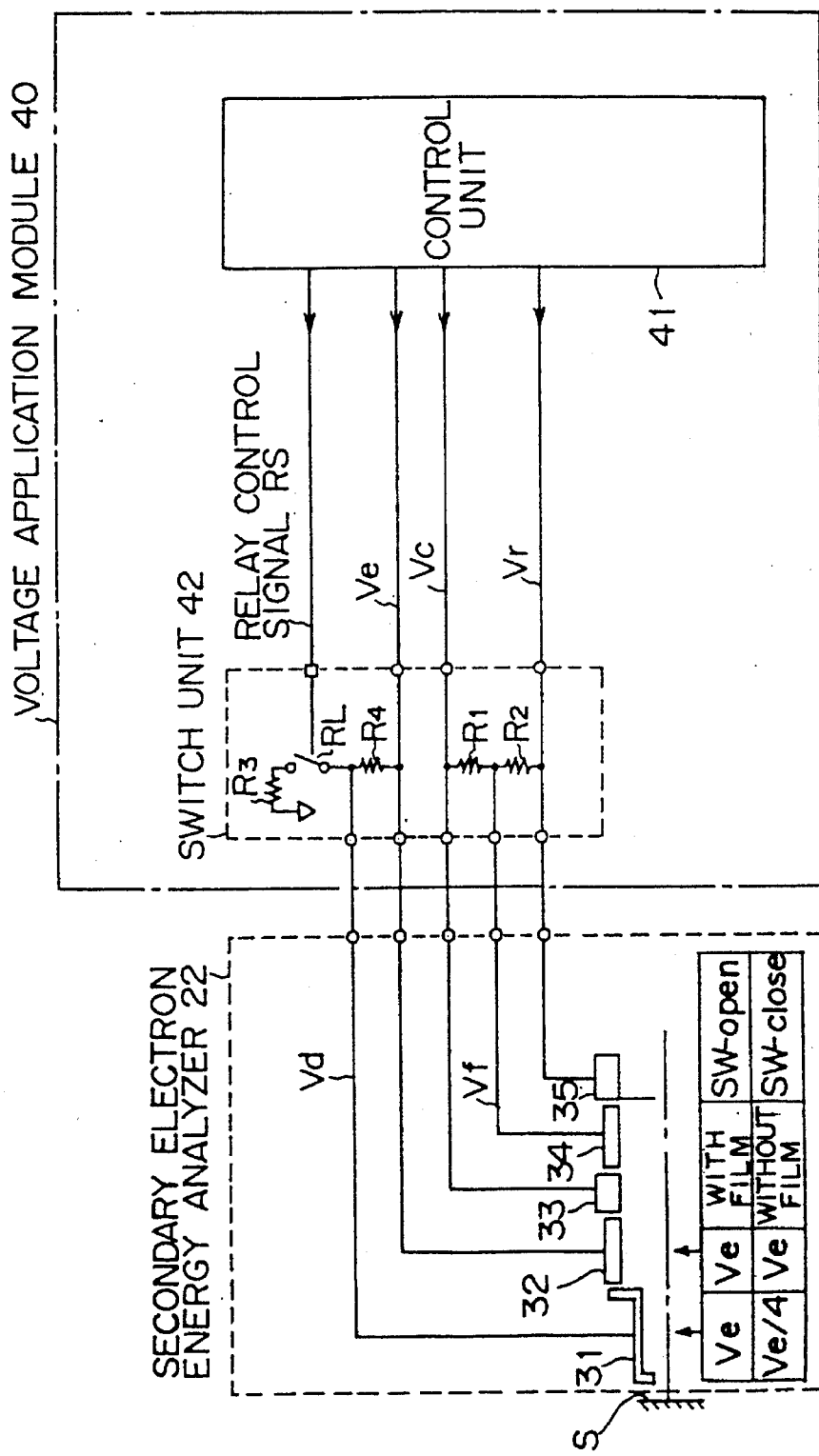
FIG. 9 is a circuit diagram illustrating an example of a power supply module 40 for use in the electron beam apparatus pursuant to a first embodiment of this invention.

FIG. 9 is a circuit diagram illustrating an example of a power supply module 40 for use in the electron beam apparatus pursuant to a first embodiment of this invention.

The power supply module 40 is a module for applying an appropriate voltage to each electrode, such that each pair of neighboring cylindrical electrodes forms an electrostatic lens for collimating a secondary electron e2.

The power supply module 40 has a control unit 41 output three independently controllable voltages Ve, Vc and Vr, and has a switch unit 42 distribute them to each of the first cylindrical electrode 31, the second cylindrical electrode 32, the third cylindrical electrode 33, the fourth cylindrical electrode 34 and the planar retarding mesh electrode 35.

More specifically, the power supply module 40 applies the three independently controllable voltages Ve, Vc and Vr "as is" to the second cylindrical electrode 32, the third cylindrical electrode 33 and the planar retarding mesh electrode 35.

The switch unit 42 has two resistors R1 and R2 having the same resistance value of about one megaohm connect the third cylindrical electrode 33 to the fourth cylindrical electrode 34 and the fourth cylindrical electrode 34 to the planar retarding mesh electrode 35, respectively. Consequently, the power supply module 40 applies to the fourth cylindrical electrode 34 Vf, a mean voltage between Vc and Vr, i.e. Vf=(Vc+Vr)/2.

The power supply module 40 has the control unit 41 output to the switch unit 42 a relay control signal RS, dependent on whether the sample surface S of a sample such as LSI to be measured is with or without an insulation cover film, for having the switch unit 42 open or close a relay switch RL, thereby changing the voltage Vd applied to the first cylindrical electrode 31.

That is, when the sample is without an insulation cover film, the relay control signal RS has the switch unit 42 open the relay switch RL, thus applying to the first cylindrical electrode 31 voltage Vd the same as voltage Ve applied to the second cylindrical electrode 32.

On the other hand, when the sample is with an insulation cover film, the relay control signal RS has the switch unit 42 close the relay switch RL, thus applying to the first cylindrical electrode 31 voltage Vd lower than voltage Ve applied to the second cylindrical electrode 32, which is obtained as Ve.R3/(R3+R4) by two resistors R3 and R4.

If, for example, they have resistance values of five megohms and fifteen megohms [15 MΩ], respectively, the power supply module 40 has the switch unit 42 apply to the first cylindrical electrode 31, Ve/4 when the sample is with an insulation cover film, and Ve when the sample is without an insulation cover film.

At this time, the power supply module 40 has the control unit 41 apply to the third cylindrical electrode 33 voltage Vc having an optimal value in correspondence with voltage Vd applied to the first cylindrical electrode 31. It is desirable that the optimal value falls in an approximate range between one-fifth and one-twentieth of voltage Ve applied to the second cylindrical electrode 32. The most optimal value is around one-tenth of voltage Ve.

The power supply module 40 has the control unit 41 control the voltages Vd, Ve, Vc, Vf and Vr applied respectively to the first cylindrical electrode 31, the second cylindrical electrode 32, the third cylindrical electrode 33, the fourth cylindrical electrode 34 and the planar retarding mesh electrode 35 to have an approximate relation Vd>Ve>Vc>Vf>Vr, such that a duo of the first cylindrical electrode 31 and the second cylindrical electrode 32 forms an acceleration type electrostatic lens LA, and a duo of the second cylindrical electrode 32 and the third cylindrical electrode 33 forms a deceleration type electrostatic lens LB. In a case of Vd=Ve, though, a duo of the first cylindrical electrode 31 and the second cylindrical electrode 32 forms no acceleration type electrostatic lens LA, and only a duo of the second cylindrical electrode 32 and the third cylindrical electrode 33 forms a deceleration type electrostatic lens LB.

The power supply module 40 has the control unit 41 apply to the first cylindrical electrode 31 and the second cylindrical electrode 32 as high voltages Vd and Ve as possible, such that an area having a magnetic field distribution with a sharp peak has as high voltages as possible for reducing an aberration of the magnetic objective lens 21. (Refer to FIG. 7B.) Although FIG. 7B shows a case in which the first cylindrical electrode 31 has the peak of a magnetic field, it is more desirable that the second cylindrical electrode 32 constantly applied with a high voltage Ve has the peak of a magnetic field, for reducing an aberration of the magnetic objective lens 21.

Taking these factors into consideration, the power supply module 40 has the control unit 41 set voltages Ve, Vc and Vr as follows, for example:

Ve≈1 kV, Vc≈100 V and Vr≈−20 V–20 V.

FIG. 10A is a graph illustrating the relative positions of two cylindrical electrodes K1 and K2 forming an electrostatic lens.

Described below is the functions of electrostatic lens of the first embodiment.

It is publicly known that an electrostatic lens formed by a pair of two cylindrical electrodes generally has these characteristics through a simple modeling. (Refer to page sixty-six of "*Electron Ion Beam Handbook, Second Edition*" compiled by No. 132 Committee of The Japan Society for the Promotion of Science, and published by The Business & Technology Daily News, Ltd. in 1986.)

$\Phi 1$ and $\Phi 2$ represent the potentials of cylindrical electrodes K1 and K2 relative to the point from which an electron is emitted, which is the sample surface for a secondary electron e2 as in the description of this invention.

FIG. 10B is a schematic diagram illustrating the trajectory of a secondary electron e2 passing through the electrostatic lens formed by two cylindrical electrodes K1 and K2.

Because an electrostatic lens refracts the trajectory of an electron emitted from a point A of an object side, the electron converges finally at a point B on an image side after flying over a trajectory in correspondence with its injection angle to the lens.

Here, fi represents a distance (focal length) from a position at which an electron e11 emitted in parallel with an optical axis Z starts to be refracted by an electrostatic lens to a position at which the electron e11 crosses the optical axis Z, and F1 represents a distance from the origin of Z coordinate O to the position at which the electron e11 crosses the optical axis Z.

Also, fo represents a distance (focal length) from a position at which an electron e12 emitted in an angle $\alpha 0$ against an optical axis Z crosses the optical axis Z to a position at which the electron e12 starts to be refracted in parallel with the optical axis Z by an electrostatic lens, and Fo represents a distance from origin of Z coordinate O to the position at which the electron e12 crosses the optical axis Z.

FIG. 10C is a graph illustrating the lens characteristics of the electrostatic lens formed by two cylindrical electrodes K1 and K2.

Defined as a lens parameter $\Phi 2/\Phi 1$ is the inverse of the ratio of respective potentials $\Phi 1$ and $\Phi 2$ of two cylindrical electrodes K1 and K2. Then, the larger a lens parameter $\Phi 2/\Phi 1$ is, the smaller focal lengths fi and fo are, which means that the lens causes a stronger refraction. On the other hand, the smaller a lens parameter $\Phi 2/\Phi 1$ is, the larger focal lengths fi and fo are, which means that the lens causes a weaker refraction. When a lens parameter $\Phi 2/\Phi 1$ approaches one, focal lengths fi and fo approach infinity and a lens fails to cause a refraction.

Assuming that 2R, which is the hollow diameter of two cylindrical electrodes K1 and K2 is sufficiently smaller than a distance D between two cylindrical electrodes K1 and K2, i.e. D<<2R, as is assumed in FIG. 10C, if a lens parameter $\Phi 2/\Phi 1$ is constant, a quotient obtained by dividing focal lengths fi and fo by 2R is constant. That is, a lens refraction intensity is proportionate to the hollow diameter 2R.

Figure 11:
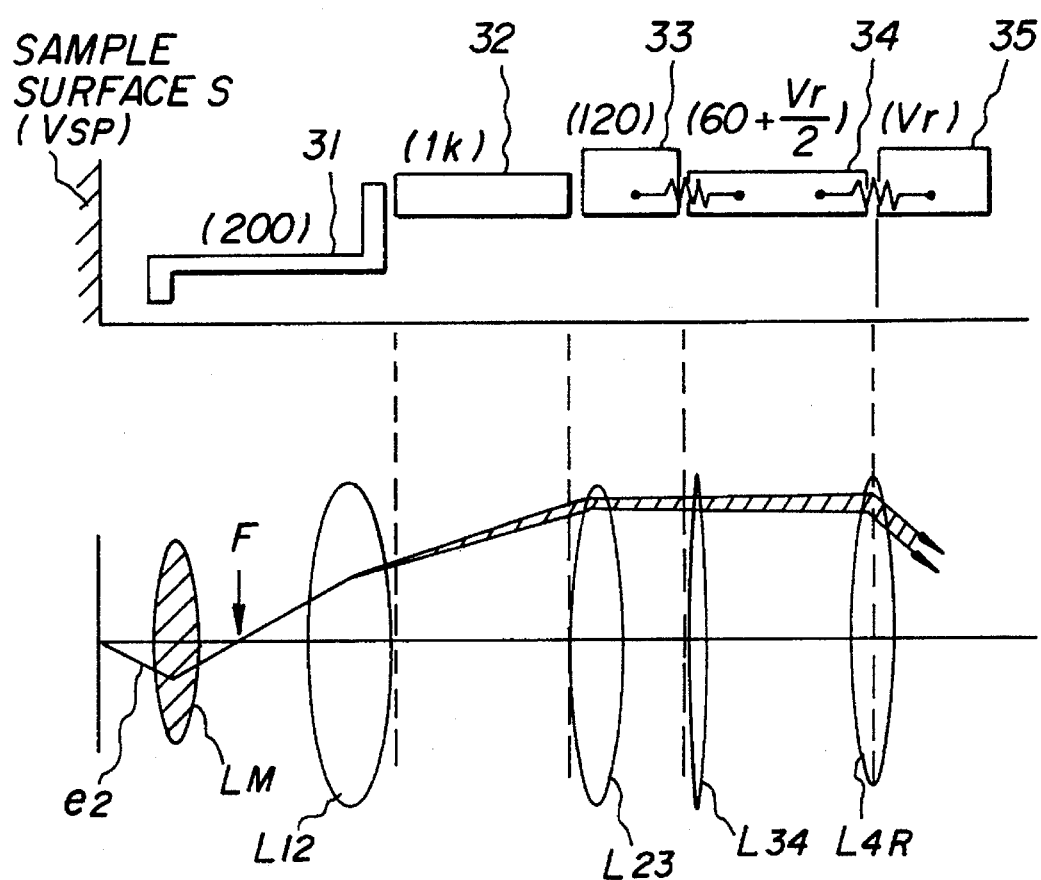
FIG. 11 is a schematic diagram outlining an electrode configuration and the trajectory of a secondary electron e2 pursuant to the first embodiment of this invention, which are based on the configurations shown in FIGS. 7A, 7B and 8 and the lens characteristics shown in FIG. 10C.

FIG. 11 is a schematic diagram outlining an electrode configuration and the trajectory of a secondary electron e2 pursuant to the first embodiment of this invention, which are based on the configurations shown in FIGS. 7A, 7B and 8 and the lens characteristics shown in FIG. 10C.

This shows an example in which, voltage Vd applied at the first cylindrical electrode 31 is two hundred volts, voltage Ve applied at the second cylindrical electrode 32 is one kilovolt, voltage Vc applied at the first cylindrical electrode 31 is one hundred twenty volts, and voltage Vr applied at the planar retarding mesh electrode 35 is equal to a sample voltage Vsp applied at a sample, such that theoretically any secondary electron e2 can pass through the planar retarding mesh electrode 35.

As discussed in the description of FIG. 9, the switch unit 42 has two resistors R1 and R2 having the same resistance value of about one megaohm connect the third cylindrical electrode 33 to the fourth cylindrical electrode 34 and the fourth cylindrical electrode 34 to the planar retarding mesh electrode 35, respectively. Consequently, the power supply module 40 applies to the fourth cylindrical electrode 34 Vf, a mean voltage between Vc(=120 V) and Vr(=Vsp), i.e. Vf=(Vc+Vr)/2=60+½Vsp.

Assuming that a duo of two cylindrical electrodes e.g. K1 and K2 applied with different voltages always form an electrostatic lens, a total of five lenses are constructed, which are from the side of sample surface S a lens LM due to a magnetic field distribution, an acceleration type electrostatic lens L12 formed between the first cylindrical electrode 31 and the second cylindrical electrode 32, a deceleration type electrostatic lens L23 formed between the second cylindrical electrode 32 and the third cylindrical electrode 33, a deceleration type electrostatic lens L34 formed between the third cylindrical electrode 33 and the fourth cylindrical electrode 34, and a deceleration type electrostatic lens L4R formed between the fourth cylindrical electrode 34 and the planar retarding mesh electrode 35.

With this lens configuration, lens LM due to a magnetic field distribution focuses at the focal point F a secondary electron e2 emitted from the sample surface S. Then, four electrostatic lenses L12, L23, L34 and L4R refract the secondary electron e2 after trajected straight.

Table 1 below illustrates the focal lengths f (mm) of the four electrostatic lenses L12, L23, L34 and L4R and their variation rates Δf/f obtained by the lens characteristics shown in FIG. 10C.

TABLE 1

| STATIC ELECTRICITY LENS | L12 | L23 | L34 | L4P |
|---|---|---|---|---|
| LENS PARAMETER Φ2/Φ1 | 4.9–5.4 | 8.2–9.5 | 1.9 | 21–18 |
| FOCAL LENGTH f(mm) | 18–16 | 29–27 | 130 | 20–22 |
| F.L. VARIATION RATE Δf/f | 11% | 7% | 0% | 10% |

FIG. 11 also shows the trajectory of the secondary electron e2 determined by the values shown in Table 1. The trajectory of the secondary electron e2 reveals the following two issues:

First, of the four electrostatic lenses L12, L23, L34 and L4P, ones that have shorter focal lengths and refract the secondary electron e2 relatively strongly, i.e. ones more responsible for collimating the secondary electron e2 and needed in this invention, are two electrostatic lenses L12 and L23.

Second, the focal length variation rates of those two electrostatic lenses L12 and L23 are relatively small and do not exceed about ten percent.

Figure 12A:
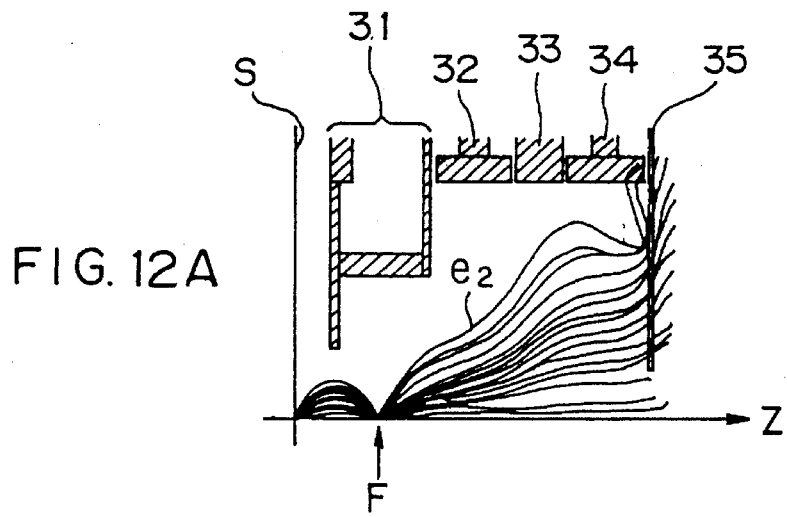
FIG. 12A is a diagram illustrating in detail a result of analyzing the trajectory of a secondary electron e2 in the first embodiment, representing a case in which an extraction voltage Ve is low, when a sample voltage Vsp is minus twenty volts.

FIG. 12A is a diagram illustrating in detail a result of analyzing the trajectory of a secondary electron e2 in the first embodiment, representing a case in which an extraction voltage Vd is low, when a sample voltage Vsp is minus twenty volts.

Figure 12B:
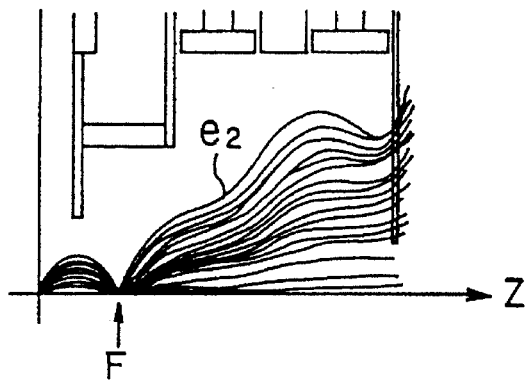
FIG. 12B is a diagram illustrating in detail a result of analyzing the trajectory of a secondary electron e2 in the first embodiment, representing a case in which an extraction voltage Ve is low, when a sample voltage Vsp is zero volts.

FIG. 12B is a diagram illustrating in detail a result of analyzing the trajectory of a secondary electron e2 in the first embodiment, representing a case in which an extraction voltage Vd is low, when a sample voltage Vsp is zero volts.

Figure 12C:
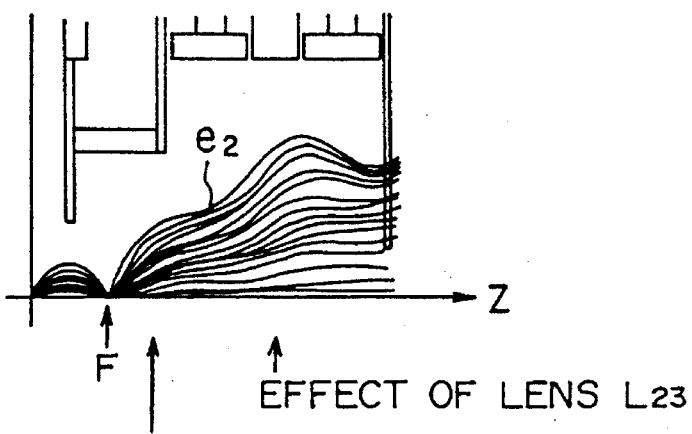
FIG. 12C is a diagram illustrating in detail a result of analyzing the trajectory of a secondary electron e2 in the first embodiment, representing a case in which an extraction voltage Ve is low, when a sample voltage Vsp is twenty volts [20 v]

FIG. 12C is a diagram illustrating in detail a result of analyzing the trajectory of a secondary electron e2 in the first embodiment, representing a case in which an extraction voltage Vd is low, when a sample voltage Vsp is twenty volts.

As is evident from those drawings, similarly to the modeled prediction, the set of lenses whose configuration is discussed in the description of FIG. 11 collimates a secondary electron e2 and ensures its perpendicular injection into the planar retarding mesh electrode 35 as long as the sample voltage Vsp remains in a range between minus twenty volts and twenty volts.

A comparison between the trajectories of a secondary electron e2 shown in FIGS. 12A, 12B and 12C representing the first embodiment with those shown in FIGS. 4B, 4C and 4D representing a prior art reveals the excellence of this invention in a collimation control for a secondary electron e2.

Figure 13A:
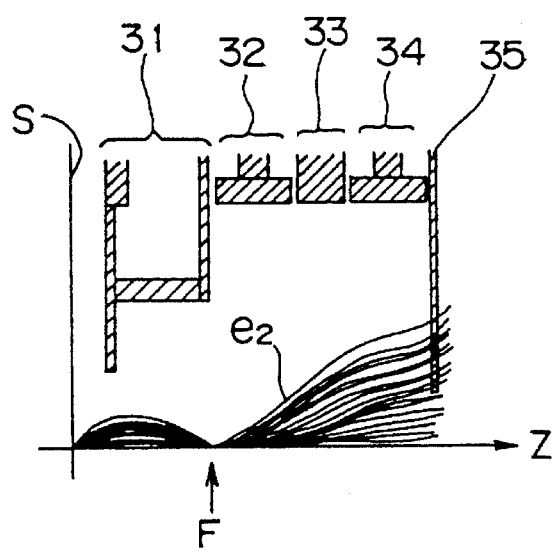
FIG. 13A is a diagram illustrating in detail a result of analyzing the trajectory of a secondary electron e2 in the first embodiment, representing a case in which an extraction voltage Vc is high, when a sample voltage Vsp is minus twenty volts.

FIG. 13A is a diagram illustrating in detail a result of analyzing the trajectory of a secondary electron e2 in the first embodiment, representing a case in which an extraction voltage Vd is high, when a sample voltage Vsp is minus twenty volts.

Figure 13B:
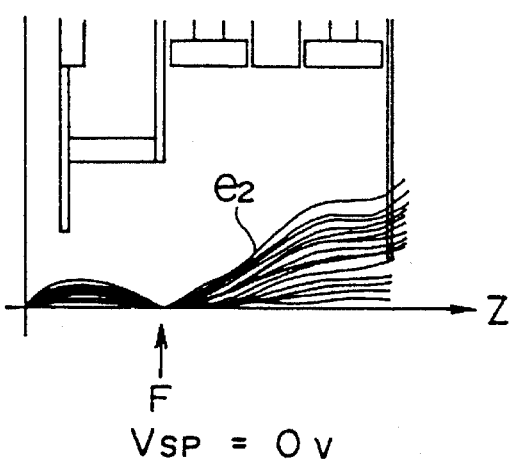
FIG. 13B is a diagram illustrating in detail a result of analyzing the trajectory of a secondary electron e2 in the first embodiment, representing a case in which an extraction voltage Ve is high, when a sample voltage Vsp is zero volts.

FIG. 13B is a diagram illustrating in detail a result of analyzing the trajectory of a secondary electron e2 in the first embodiment, representing a case in which an extraction voltage Vd is high, when a sample voltage Vsp is zero volts.

Figure 13C:
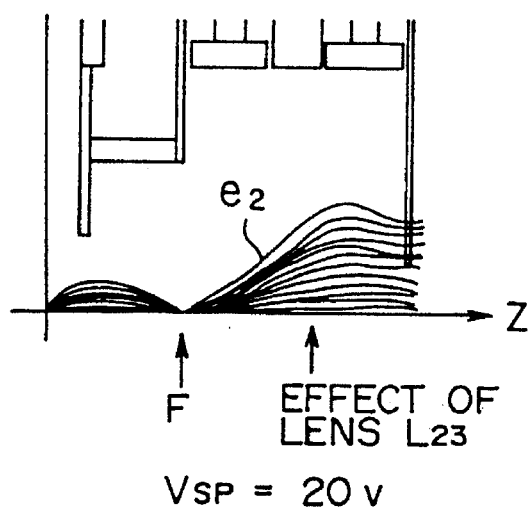
FIG. 13C is a diagram illustrating in detail a result of analyzing the trajectory of a secondary electron e2 in the first embodiment, representing a case in which an extraction voltage Ve is high, when a sample voltage Vsp is twenty volts.

FIG. 13C is a diagram illustrating in detail a result of analyzing the trajectory of a secondary electron e2 in the first embodiment, representing a case in which an extraction voltage Vd is high, when a sample voltage Vsp is twenty volts.

When a sample cannot be charged up, i.e. when a sample surface S is without an insulation cover film, it is desirable to apply as high an extraction voltage Vd as possible to the first cylindrical electrode 31, for improving an S/N (signal/noise) ratio.

In the first embodiment, when the sample is without an insulation cover film, the relay control signal RS has the switch unit 42 open the relay switch RL, thus applying to the first cylindrical electrode 31 voltage Vd the same as voltage Ve applied to the second cylindrical electrode 32, which is a high voltage such as one kilovolt. (Refer to FIG. 9.)

Although an application of the same voltage to the first cylindrical electrode 31 and the second cylindrical electrode 32 prevents acceleration type electrostatic lens L12 from being formed between the first cylindrical electrode 31 and the second cylindrical electrode 32, this does not affect deceleration type electrostatic lens L23 formed between the second cylindrical electrode 32 and the third cylindrical electrode 33, which can sufficiently collimate a secondary electron e2.

As is apparent from these drawings that show critical cases in which voltage Vd applied to the first cylindrical electrode 31 is raised high to be equal to voltage Ve applied to the second cylindrical electrode 32, even without acceleration type electrostatic lens L12 formed between the first cylindrical electrode 31 and the second cylindrical electrode 32, deceleration type electrostatic lens L23 formed between the second cylindrical electrode 32 and the third cylindrical electrode 33 singly can collimate a secondary electron e2 when a sample voltage Vsp has a range between minus twenty volts and twenty volts.

Although the range of a sample voltage Vsp shown in these drawings, as well as in FIGS. 12A, 12B and 12C, is between minus twenty volts and twenty volts, it is quite possible for a sample voltage Vsp to vary in a wider range, if the overall applied voltages are increased proportionately. The limit on such a range is deemed to be determined only by the constraint on manufacturing electrodes having enough insulation capacities.

Also, an application of a higher voltage Ve, e.g. three kilovolts instead of one kilovolt, to the second cylindrical electrode 32 brings about a further advantage, by composing both acceleration type electrostatic lens L12 formed between the first cylindrical electrode 31 and the second cylindrical electrode 32 and deceleration type electrostatic lens L23 formed between the second cylindrical electrode 32 and the third cylindrical electrode 33, that the aberration of a primary electron beam e1 passing through a magnetic lens can be reduced substantially and that the beam diameter of the primary electron beam e1 can further be reduced.

This is because an increase in the kinetic energy of a secondary electron e2 passing through the magnetic objective lens 21 causes the trajectory of a secondary electron e2 to be less divergent, i.e. to be nearer to the optical axis Z of the magnetic objective lens 21, thereby reducing an aberration.

As well, although it is less desirable than the application of a higher voltage as described above, it is equally possible to equalize voltage Ve applied to the second cylindrical electrode 32 with voltage Vc applied to the third cylindrical electrode 33, thereby having acceleration type electrostatic lens L12 formed between the first cylindrical electrode 31 and the second cylindrical electrode 32 and deceleration type electrostatic lens L34 formed between the third cylindrical electrode 33 and the fourth cylindrical electrode 34 collimate a secondary electron e2.

Although the fourth cylindrical electrode 34 is not essential to this invention, its provision is desirable, because it mitigates both a refraction by a deceleration type electrostatic lens L3R to be unnecessarily formed between the third cylindrical electrode 33 and the planar retarding mesh electrode 35 and its variation rate caused by the variation of a sample voltage Vsp, as described below.

An application of voltage Vf=(Vc+Vr)/2 to the fourth cylindrical electrode 34 prevents the refraction intensity of deceleration type electrostatic lens L34 formed between the third cylindrical electrode 33 and the fourth cylindrical electrode 34 from depending on the sample voltage Vsp, as shown in Table 1. This enables a refraction by deceleration type electrostatic lens L3R to be unnecessarily formed between the third cylindrical electrode 33 and the planar retarding mesh electrode 35 to be nearly constant, which further facilitates a collimation control for a secondary electron e2.

Described below is its underlining principle.

Considering the third cylindrical electrode 33 and the fourth cylindrical electrode 34 respectively as two cylindrical electrodes K1 and K2 shown in FIG. 10A, the following expressions represent their respective potentials $\Phi 1$ and $\Phi 2$ respect to the secondary electron, when the emission energy of a secondary electron e2 is ignored.

$\Phi 1 = Vf - Vsp = (Vc + Vr)/2 - Vsp$ $\Phi 2 = Vc - Vsp$

Here, it is theoretically necessary that voltage Vr applied at the planar retarding mesh electrode 35 is equal to the sample voltage Vsp for every secondary electron e2 to pass through the planar retarding mesh electrode 35. Because Vr=Vsp, $\Phi 1 = (Vc + Vr)/2 - Vsp = (Vc - Vsp)/2$ $\Phi 2 / \Phi 1 = 2$ Thus, it is clear that the lens parameter $\Phi 2/\Phi 1$ at this time is independent of the sample voltage Vsp.

A variation in the sample voltage Vsp causes a variation in the refraction intensity of deceleration type electrostatic lens L4R formed between the fourth cylindrical electrode 34 and the planar retarding mesh electrode 35. However, an increase in the refraction intensity of deceleration type electrostatic lens L34 formed between the third cylindrical electrode 33 and the fourth cylindrical electrode 34 by increasing the ratio of voltage Vc applied at the third cylindrical electrode 33 against voltage Vf applied at the fourth cylindrical electrode 34 decreases the refraction intensity of deceleration type electrostatic lens L4R formed between the fourth cylindrical electrode 34 and the planar retarding mesh electrode 35, thereby minimizing its undesirable effect.

For instance, assuming that resistor R1 connecting the third cylindrical electrode 33 to the fourth cylindrical electrode 34 has a resistance value of nine megohms, and resistor R2 connecting the fourth cylindrical electrode 34 to the planar retarding mesh electrode 35 has a resistance value of one megaohm, the lens parameter $\Phi 2/\Phi 1$ of deceleration type electrostatic lens L34 formed between the third cylindrical electrode 33 and the fourth cylindrical electrode 34 is always ten, i.e.

$\Phi 2 / \Phi 1 = 10,$ because $\Phi 1 = (Vc + 9Vsp)/10 - Vsp = (Vc - Vsp)/10$ $\Phi 2 = Vc - Vsp$ The lens parameter $\Phi 2/\Phi 1$ being ten indicates a relatively high refraction intensity. Yet, this is quite desirable in achieving an aim of this invention, because a variation in the sample voltage Vsp causes no variation whatsoever in the effect of deceleration type electrostatic lens L34 formed between the third cylindrical electrode 33 and the fourth cylindrical electrode 34.

Figure 14:
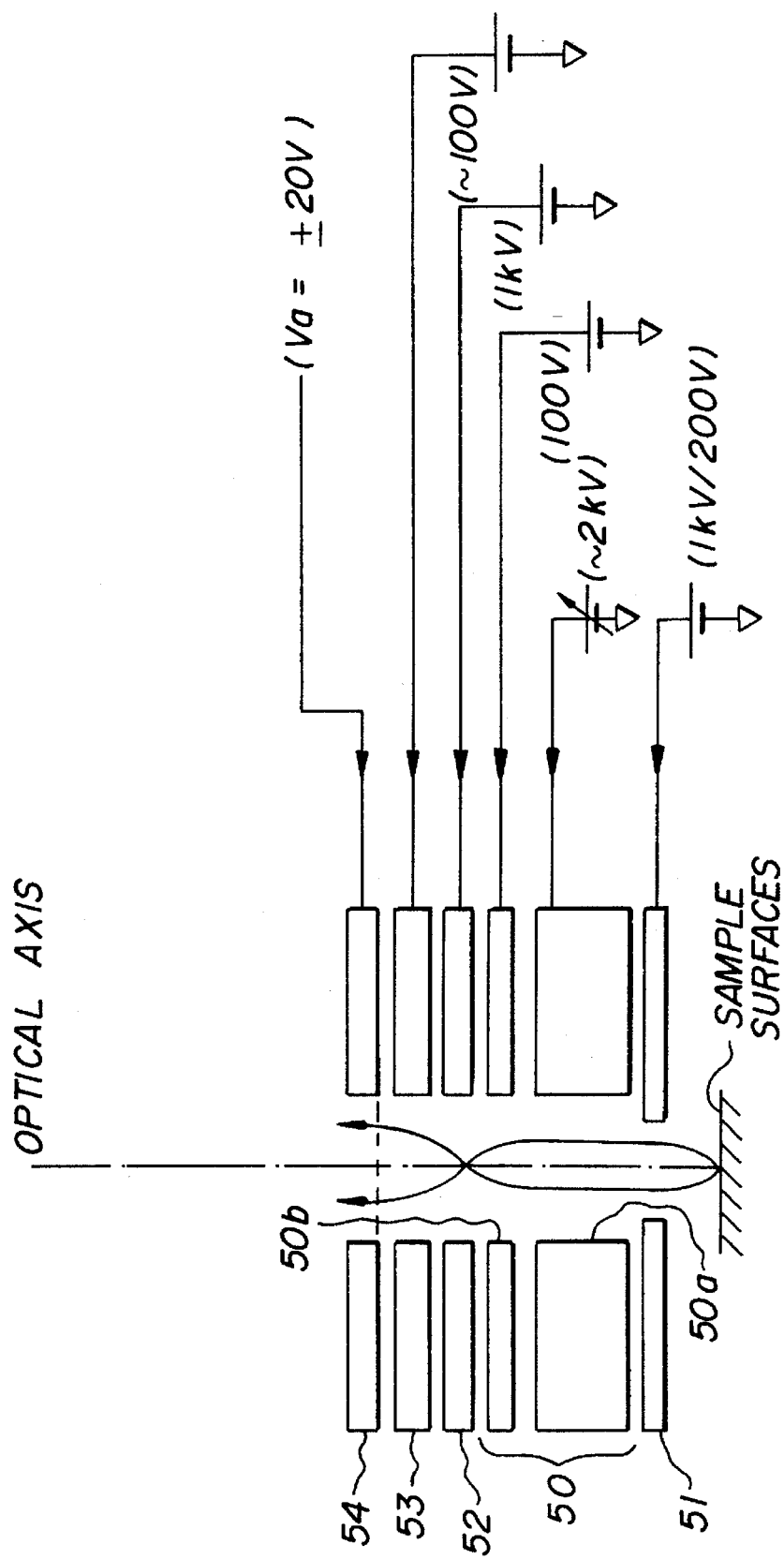
FIG. 14 is a schematic diagram outlining an electrode configuration and the trajectory of a secondary electron e2 pursuant to a second embodiment of this invention.

FIG. 14 is a schematic diagram outlining an electrode configuration and the trajectory of a secondary electron e2 pursuant to a second embodiment of this invention.

Whereas the magnetic objective lens 21 is discussed in the description of the first embodiment, the second embodiment assumes an electrostatic type lens refracting a primary electron beam e2 by its electrical field distribution.

Basically, the second embodiment assumes a configuration similar to that of the first embodiment.

First, a secondary electron energy analyzer of the second embodiment provides a first cylindrical electrode 51 operating as an extraction electrode for extracting and accelerating a secondary electron e2 in the proximity of a sample surface S.

Second, it provides a cylindrical objective lens electrode 50 for composing an electrostatic objective lens. The cylindrical objective lens electrode 50 comprises a large main electrode 50a provided immediately above the first cylindrical electrode 51 and a small subordinate electrode 50b provided thereabove. The cylindrical objective lens electrode 50 controls the focus of an electrostatic lens formed between the large main electrode 50a and the small subordinate electrode 50b by adjusting a voltage applied to the former e.g. in an extent to a maximum of two kilovolts, thereby focusing a primary electron beam e1 on the sample surface S.

Third, it provides a second cylindrical electrode 52, a third cylindrical electrode 53 and a planar retarding mesh electrode 54 in this sequence.

Although FIG. 14 does not show a secondary electron detector, as with the secondary electron detector 23 for the magnetic objective lens 21 for use in the first embodiment, it is desirable to provide the secondary electron detector externally above the electrostatic objective lens composed by the cylindrical objective lens electrode 50, for shortening the focal length and reducing the aberration of the electrostatic objective lens.

The electrostatic objective lens composed by the cylindrical objective lens electrode 50 requires a voltage application in a range between three kilovolts and five kilovolts. Consequently, it has an approximate ratio of five for four [5:4] between the kinetic energies of a primary electron beam e1 and a secondary electron e2. This is in contrast to a magnetic objective lens having an approximate ratio of two to one. This means that, in a case of the second embodiment as against a case of the first embodiment, a primary electron beam e1 and a secondary electron e2 have much closer kinetic energies, and therefore that a secondary electron e2 is focused at a point far away from the sample surface S.

Nonetheless, a deceleration type electrostatic lens formed between the second cylindrical electrode 52 and the third cylindrical electrode 53 similarly collimates a secondary electron e2, despite that electrostatic lenses have a voltage application different from that in the case of the first embodiment. Hence, the second embodiment also produces a desirable trajectory for a secondary electron e2, as with the first embodiment.

Although FIG. 14 does not show a power supply module for applying an appropriate voltage to each electrode, a unit similar to the power supply module 40 shown in FIG. 9 for use in the first embodiment is mutatis mutandis applicable for use in the second embodiment, except that voltage values for respective electrodes are of course different.

Because an in-lens type secondary electron energy analyzer of this invention has an electrostatic lens collimate a secondary electron e2, it enables even an objective lens with a narrow magnetic field distribution hitherto having a difficulty in collimating a secondary electron e2 to attain an easy collimation control for a secondary electron e2.

As well, the formation of electrostatic lenses by respective pairs of neighboring ones of at least three cylindrical electrodes realizes an easy collimation control for a secondary electron e2 through the adjustment of the voltage ratio between the two cylindrical electrodes in each pair. As a result, it becomes possible to raise voltage levels applied to an overall electrode system, which enables a precise collimation control independent of a variation in the sample voltage Vsp e.g. due to the charge-up of an insulation cover film.

Further, a constant application of a high voltage to a second cylindrical electrode (32 or 52) aimed at forming an effective deceleration type electrostatic lens between the second cylindrical electrode (32 or 52) and a third cylindrical electrode (33 or 53) realizes an excellent collimation control, even when an extraction voltage applied to a first cylindrical electrode (31 or 51) is kept to a minimum for preventing a sample from being charged up.

Thus, this invention enables an in-lens type secondary electron energy analyzer to analyze the kinetic energy of a secondary electron e2 irrespective of its emission angle from a sample surface S without being affected by an extraction voltage or the charge-up of an insulation cover film, thereby contributing to the accuracy in a voltage measurement and the improvement in a reliability.

Although some representative embodiments have been described above, one of ordinary skill in the art can construct and implement a wide array of variations in accordance with a principle underlying this invention.

What is claimed is:

1. An electron beam apparatus having, inside of an objective lens for focusing a primary electron beam and irradiating it on a sample surface, a secondary electron energy analyzer for analyzing the energy of a secondary electron emitted from a point on said sample surface at which said primary electron beam is irradiated, said secondary electron energy analyzer comprising:

a planar retarding mesh electrode means having a planar surface for creating an electrical field for decelerating said secondary electron; and a collimation means for forming at least one electrostatic lens by a nonuniform electrical field distribution over all secondary electrons emitted from said sample, said at least one electrostatic lens collimating the trajectory of said secondary electron for injection thereof into said planar retarding mesh electrode means.

2. The electron beam apparatus according to claim 1, wherein:

at least one electrostatic lens formed by said collimation means is a deceleration type lens for collimating the trajectory of said secondary electron by decelerating said secondary electron.

3. The electron beam apparatus according to claim 1, wherein:

at least one electrostatic lens formed by said collimation means is an acceleration type lens for collimating the trajectory of said secondary electron by accelerating said secondary electron; and at least another one electrostatic lens formed by said collimation means is a deceleration type for collimating the trajectory of a secondary electron accelerated by said acceleration type lens by decelerating said secondary electron accelerated by said acceleration type lens.

4. The electron beam apparatus according to claim 3, wherein:

the refraction power of said acceleration type lens is made variable, whereas the refraction power of said deceleration type lens is fixed.

5. The electron beam apparatus according to claim 3, wherein:

a refraction power of said deceleration type lens is made variable, whereas a refraction power of said acceleration type lens is fixed.

6. The electron beam apparatus according to claim 1, wherein:

said collimation means comprises at least three cylindrical electrodes positioned between said sample surface and said planar retarding mesh electrode means and numbered first, second and third from the one closest to the sample surface; and further comprising a power supply means, provided outside of said collimation means, for applying an appropriate voltage to each of said cylindrical electrodes neighboring cylindrical electrodes to form an electrostatic lens.

7. The electron beam apparatus according to claim 6, further comprising:

a fourth cylindrical electrode provided between said third cylindrical electrode and said planar retarding mesh electrode means, a first resistor having a predetermined resistance value and connecting said third cylindrical electrode to said fourth cylindrical electrode; and a second resistor having a predetermined resistance value and connecting said fourth cylindrical electrode to said planar retarding mesh electrode means.

8. The electron beam apparatus according to claim 7, wherein:

said first resistor connecting said third cylindrical electrode to said fourth cylindrical electrode and said second resistor connecting said fourth cylindrical electrode to said planar retarding mesh electrode means have the same resistance value.

9. The electron beam apparatus according to claim 6, further comprising:

a plurality of cylindrical electrodes provided between said third cylindrical electrode and said planar retarding mesh electrode means, resistors having respectively predetermined resistance values for connecting neighboring ones of said third cylindrical electrode, said plurality of cylindrical electrodes, and said planar retarding mesh electrode means.

10. The electron beam apparatus according to claim 6, wherein said power supply means comprises:

a control means for independently controlling voltages applied to said second cylindrical electrode, said third cylindrical electrode and said planar retarding mesh electrode means, and for outputting a control signal dependent on whether the sample surface is with or without an insulation cover film; and a switch means for switching the magnitude of a voltage applied to said first cylindrical electrode in accordance with said control signal.

11. The electron beam apparatus according to claim 10, wherein:

said switch means switches the magnitude of a voltage applied to said first cylindrical electrode in accordance with said control signal, such that a voltage applied to said first cylindrical electrode when said sample surface is with an insulation cover film is lower than a voltage applied to said first cylindrical electrode when said sample surface is without an insulation cover film.

12. The electron beam apparatus according to claim 1, further comprising:

a cylindrical insulation supporter means for supporting as a whole unit all cylindrical electrodes composing said collimation means.

13. An electron beam apparatus having, inside of an objective lens for focussing a primary electron beam and irradiating it on a sample surface, a secondary electron energy analyzer for analyzing the energy of a secondary electron emitted from a point on said sample surface at which said primary electron beam is irradiated, said objective lens being a magnetic field type refracting an electron by a magnetic field distribution, said secondary electron energy analyzer comprising:

a planar retarding mesh electrode means having a planar surface for creating an electrical field for decelerating said secondary electron;

a collimation means having at least three cylindrical electrodes positioned between said sample surface and said planar retarding mesh electrode means and numbered first, second and third from the one closest to the sample surface; and a power supply means, provided outside of said collimation means, for applying an appropriate voltage to each of said cylindrical electrodes neighboring cylinrical electrodes to form an electrostatic lens produced by a non-uniform electric field.

14. The electron beam apparatus according to claim 13, wherein:

a peak of the magnetic field distribution of said magnetic lens resides at either one of said first cylindrical electrode and said second cylindrical electrode.

15. The electron beam apparatus according to claim 13, wherein:

said first cylindrical electrode, positioned in a proximity to said sample surface, is an extraction electrode for extracting a secondary electron from said sample surface through acceleration;

said second cylindrical electrode, positioned next to said first cylindrical electrode, is an acceleration electrode for collimating said secondary electron extracted by said first cylindrical electrode through further acceleration; and said third cylindrical electrode, positioned next to said second cylindrical electrode, is a collimation electrode for collimating said secondary electron accelerated by said second cylindrical electrode through deceleration for injection into said retarding mesh electrode means.

16. The electron beam apparatus according to claim 15, wherein:

said power supply means constantly applies to said second cylindrical electrode a positive voltage not lower than that applied to said first cylindrical electrode.

17. The electron beam apparatus according to claim 16, wherein said power supply means comprises:

a control means for independently controlling voltages applied to said second cylindrical electrode, said third cylindrical electrode and said planar retarding mesh electrode means, and for outputting a control signal dependent on whether the sample surface is with or without an insulation cover film; and a switch means for switching the magnitude of a voltage applied to said first cylindrical electrode in accordance with said control signal.

18. The electron beam apparatus according to claim 17, wherein:

said switch means switches the magnitude of a voltage applied to said first cylindrical electrode in accordance with said control signal, such that the voltage applied to said first cylindrical electrode when said sample surface is with an insulation cover film is lower than that applied to the same when said sample surface is without an insulation cover film.

19. The electron beam apparatus according to claim 17, wherein:

said control means sets the voltage applied to said third cylindrical electrode in a range between one-fifth and one-twentieth of the voltage applied to said second cylindrical electrode.

20. An electron beam apparatus having, inside of an objective lens for focussing a primary electron beam and irradiating it on a sample surface, a secondary electron energy analyzer for analyzing the energy of a secondary electron emitted from a point on said sample surface at which said primary electron beam is irradiated, said objective lens being an electrical field type refracting an electron by an electric field distribution, said secondary electron energy analyzer comprising:

a planar retarding mesh electrode means having a planar surface for creating an electrical field for decelerating said secondary electron;

a collimation means having at least three cylindrical electrodes positioned between said sample surface and said planar retarding mesh electrode means and numbered first, second and third from the one closest to the sample surface; and a power supply means, provided outside of said collimation means, for applying an appropriate voltage to each of said cylindrical electrodes neighboring cylindrical electrodes to form an electrostatic lens produced by a non-uniform electric field.

21. The electron beam apparatus according to claim 20, wherein:

said first cylindrical electrode, positioned in a proximity to said sample surface, is an extraction electrode for extracting a secondary electron from said sample surface through acceleration;

said second cylindrical electrode, positioned next to said first cylindrical electrode, is an acceleration electrode for collimating said secondary electron extracted by said first cylindrical electrode through further acceleration; and said third cylindrical electrode, positioned next to said second cylindrical electrode, is a collimation electrode for collimating said secondary electron accelerated by said second cylindrical electrode through deceleration for injection into said retarding mesh electrode means.

22. The electron beam apparatus according to claim 21, wherein:

said power supply means constantly applies to said second cylindrical electrode a positive voltage not lower than that applied to said first cylindrical electrode.

23. The electron beam apparatus according to claim 22, wherein said power supply means comprises:

a control means for independently controlling voltages applied to said second cylindrical electrode, said third cylindrical electrode and said planar retarding mesh electrode means, and for outputting a control signal dependent on whether the sample surface is with or without an insulation cover film; and a switch means for switching the magnitude of a voltage applied to said first cylindrical electrode in accordance with said control signal.

24. The electron beam apparatus according to claim 23, wherein:

said switch means switches the magnitude of a voltage applied to said first cylindrical electrode in accordance with said control signal, such that the voltage applied to said first cylindrical electrode when said sample surface is with an insulation cover film is lower than that applied to the same when said sample surface is without an insulation cover film.

25. The electron beam apparatus according to claim 23, wherein:

said control means sets the voltage applied to said third cylindrical electrode in a range between one-fifth and one-twentieth of the voltage applied at said second cylindrical electrode.

26. A method for energy analysis and detection of an electron emitted radially from a point, comprising the steps of:

(a) accelerating the electron in a specified direction parallel to an axis and reducing the speed of the electron vertical to and outward from said axis, said axis extending from said point in said specified direction;

(b) reducing the speed of the electron vertical to and outward from said axis by the electron passing through a first electrostatic lens formed by a first nonuniform electric field, said axis extending from said point in said specified direction;

(c) reducing a speed of the electron parallel to said axis and reducing the speed of the electron vertical to and outward from said axis by the electron passing through a second electrostatic lens formed by a second nonuniform electrical field;

(d) reducing the speed of the electron parallel to said axis by applying a uniform electrical field; and (e) analyzing by detecting the electron which has enough energy to pass through the uniform electrical field.

* * * * *